(12) United States Patent
Chiang et al.

(10) Patent No.: US 11,264,327 B2
(45) Date of Patent: Mar. 1, 2022

(54) BACKSIDE POWER RAIL STRUCTURE AND METHODS OF FORMING SAME

(71) Applicant: Taiwan Semiconductor Manufacturing Co., Ltd., Hsinchu (TW)

(72) Inventors: Kuo-Cheng Chiang, Zhubei (TW); Shi Ning Ju, Hsinchu (TW); Chih-Chao Chou, Hsinchu (TW); Wen-Ting Lan, Hsinchu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/939,803

(22) Filed: Jul. 27, 2020

(65) Prior Publication Data

US 2021/0134721 A1    May 6, 2021

Related U.S. Application Data

(60) Provisional application No. 62/928,155, filed on Oct. 30, 2019.

(51) Int. Cl.
*H01L 23/528* (2006.01)
*H01L 27/092* (2006.01)
(Continued)

(52) U.S. Cl.
CPC .... *H01L 23/5286* (2013.01); *H01L 21/02532* (2013.01); *H01L 21/02603* (2013.01); *H01L 21/28518* (2013.01); *H01L 21/30604* (2013.01); *H01L 21/823807* (2013.01); *H01L 21/823814* (2013.01); *H01L 21/823871* (2013.01); *H01L 27/092* (2013.01); *H01L 29/0673* (2013.01); *H01L 29/41733* (2013.01);
(Continued)

(58) Field of Classification Search
CPC .......... H01L 23/5286; H01L 21/02532; H01L 21/02603; H01L 21/28518; H01L 21/30604; H01L 21/823807; H01L 21/823814; H01L 21/823871; H01L 27/092; H01L 29/0673; H01L 29/41733; H01L 29/42392; H01L 29/45; H01L 29/66553; H01L 29/66742; H01L 29/78618; H01L 29/78696
USPC ....................................................... 257/351
See application file for complete search history.

(56) References Cited

U.S. PATENT DOCUMENTS 9,209,247 B2    12/2015 Colinge et al.
9,236,267 B2    1/2016 De et al.
(Continued)

*Primary Examiner* — Tong-Ho Kim
(74) *Attorney, Agent, or Firm* — Slater Matsil, LLP

(57) ABSTRACT

Nanostructure field-effect transistors (nano-FETs) including isolation layers formed between epitaxial source/drain regions and semiconductor substrates and methods of forming the same are disclosed. In an embodiment, a semiconductor device includes a power rail, a dielectric layer over the power rail, a first channel region over the dielectric layer, a second channel region over the first channel region, a gate stack over the first channel region and the second channel region, where the gate stack is further disposed between the first channel region and the second channel region and a first source/drain region adjacent the gate stack and electrically connected to the power rail.

20 Claims, 43 Drawing Sheets

(51) Int. Cl.
  *H01L 29/06* (2006.01)
  *H01L 29/417* (2006.01)
  *H01L 29/423* (2006.01)
  *H01L 29/45* (2006.01)
  *H01L 29/786* (2006.01)
  *H01L 21/02* (2006.01)
  *H01L 21/306* (2006.01)
  *H01L 21/285* (2006.01)
  *H01L 29/66* (2006.01)
  *H01L 21/8238* (2006.01)

(52) U.S. Cl.
  CPC ........ *H01L 29/42392* (2013.01); *H01L 29/45* (2013.01); *H01L 29/66545* (2013.01); *H01L 29/66553* (2013.01); *H01L 29/66742* (2013.01); *H01L 29/78618* (2013.01); *H01L 29/78696* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0373301 A1* | 11/2020 | Kim .................. H01L 29/42356 |
| 2020/0411436 A1* | 12/2020 | Xie .................. H01L 21/76877 |

\* cited by examiner

BACKSIDE POWER RAIL STRUCTURE AND METHODS OF FORMING SAME

PRIORITY CLAIM AND CROSS-REFERENCE

This application claims the benefit of U.S. Provisional Application No. 62/928,155, filed on Oct. 30, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
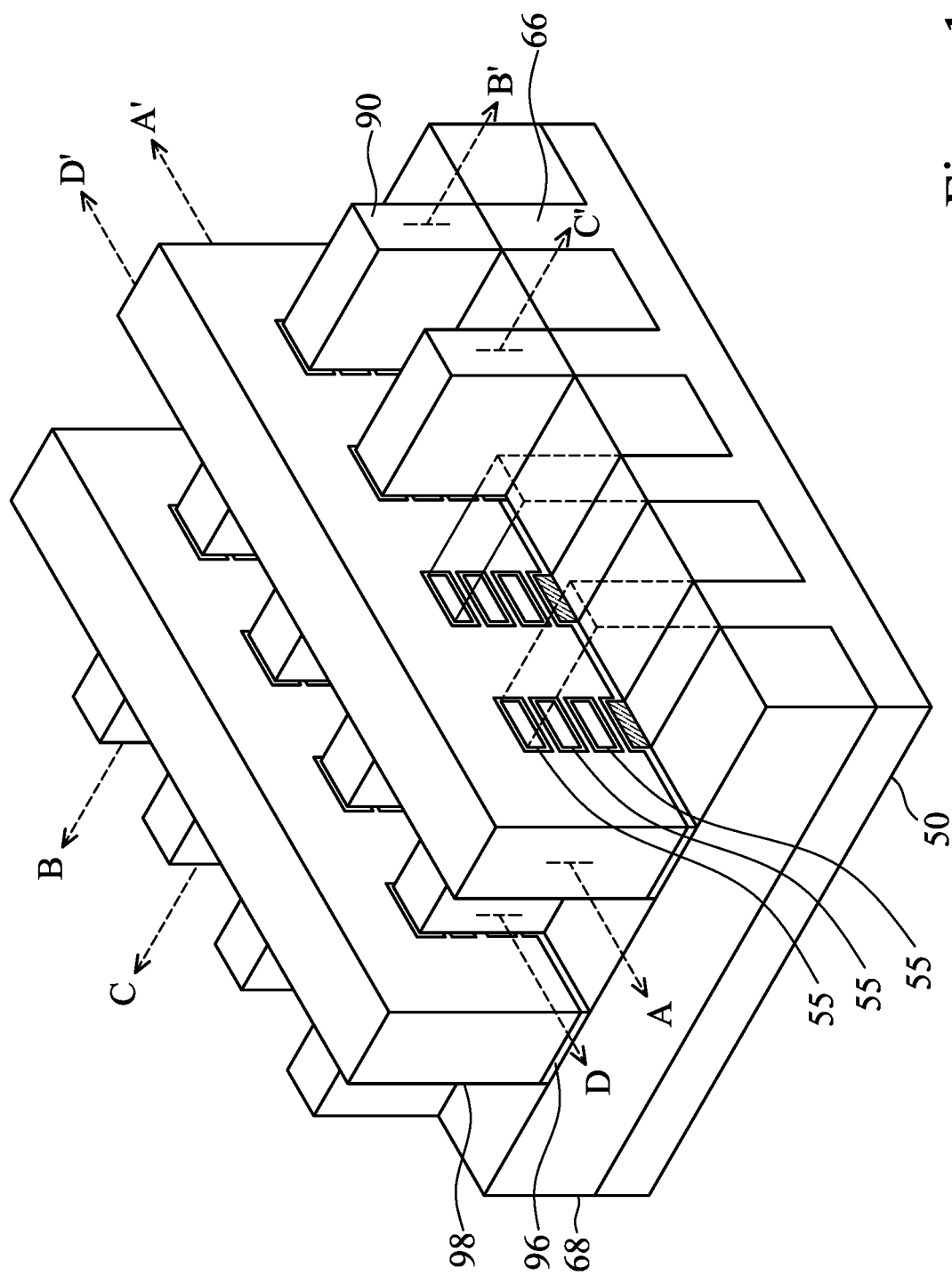
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having improved performance and methods of forming the same. The semiconductor devices may be nanostructure field-effect transistors (nano-FETs, also referred to as nanosheet field-effect transistors (NSFETs), nanowire field-effect transistors (NWFETs), or gate-all-around field-effect transistors (GAAFETs)). These embodiments include methods applied to, but not limited to, the formation of a power rail on a backside of a nano-FET. In some embodiments, the power rail may be a metal line that is coupled to a reference voltage, positive supply voltage, or the like, and in some instances, and may be used to provide power to a transistor. A thin semiconductor layer may be provided in NMOS and PMOS regions below semiconductor layers used to form channel regions in the nano-FETs. The thin semiconductor layer may be replaced with a dielectric layer. The power rail and the nano-FETs are formed on opposing sides of the dielectric layer, and dielectric layer insulates the power rail from the channel regions of the nano-FETs. Advantageous features of one or more embodiments disclosed herein may include the ability to increase the first metal layer interconnect density as well as the gate density. In addition, one or more embodiments disclosed herein may include the ability to lower electrical resistance by allowing for a wider power rail width when the power rail is formed on a backside of the nano-FETs.

FIG. 1 illustrates an example of nano-FETs in a three-dimensional view, in accordance with some embodiments. The nano-FETs comprise channel regions 55 over fins 66 on a substrate 50 (e.g., a semiconductor substrate). Isolation regions 68 are disposed in the substrate 50, and the fins 66 protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although the fins 66 are illustrated as being single, continuous materials with the substrate 50, the fins 66 and/or the substrate 50 may comprise single materials or a plurality of materials. In this context, the fins 66 refer to the portion extending between the neighboring isolation regions 68.

Gate dielectric layers 96 are along sidewalls and over top surfaces of the fins 66 and along top surfaces, sidewalls, and bottom surfaces of the channel regions 55. Gate electrodes 98 are over the gate dielectric layers 96. Epitaxial source/drain regions 90 are disposed in opposite sides of the fins 66 with respect to the gate dielectric layers 96 and the gate electrodes 98. FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 90 of a nano-FET. Cross-section B-B' is perpendicular to cross-section A-A' and is along a longitudinal axis of a fin 66 in a PMOS region of the nano-FET and in a direction of, for example, a current flow between the epitaxial source/drain regions 90 of the nano-FET. Cross-section C-C' is parallel to cross-section B-B' and extends through a fin 66 in an NMOS region of the nano-FET. Cross-section D-D' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 32 are cross-sectional views of intermediate stages in the manufacturing of nano-FETs, in accordance with some embodiments. FIGS. 2 through 5, 6A, 16A, 17A, 18A, 19A, 20A, 21, 22A and 23A illustrate reference cross-section A-A' illustrated in FIG. 1. FIGS. 6B, 7, 8, 9, 10, 11, 12, 13, 14, 15A, 16B, 17B, 18B, 19B, 20B, 22B and 23B illustrate reference cross-sections B-B' or C-C' illustrated in FIG. 1. FIGS. 15B and 15C are illustrated along reference cross-section D-D' illustrated in FIG. 1.

Figure 2:
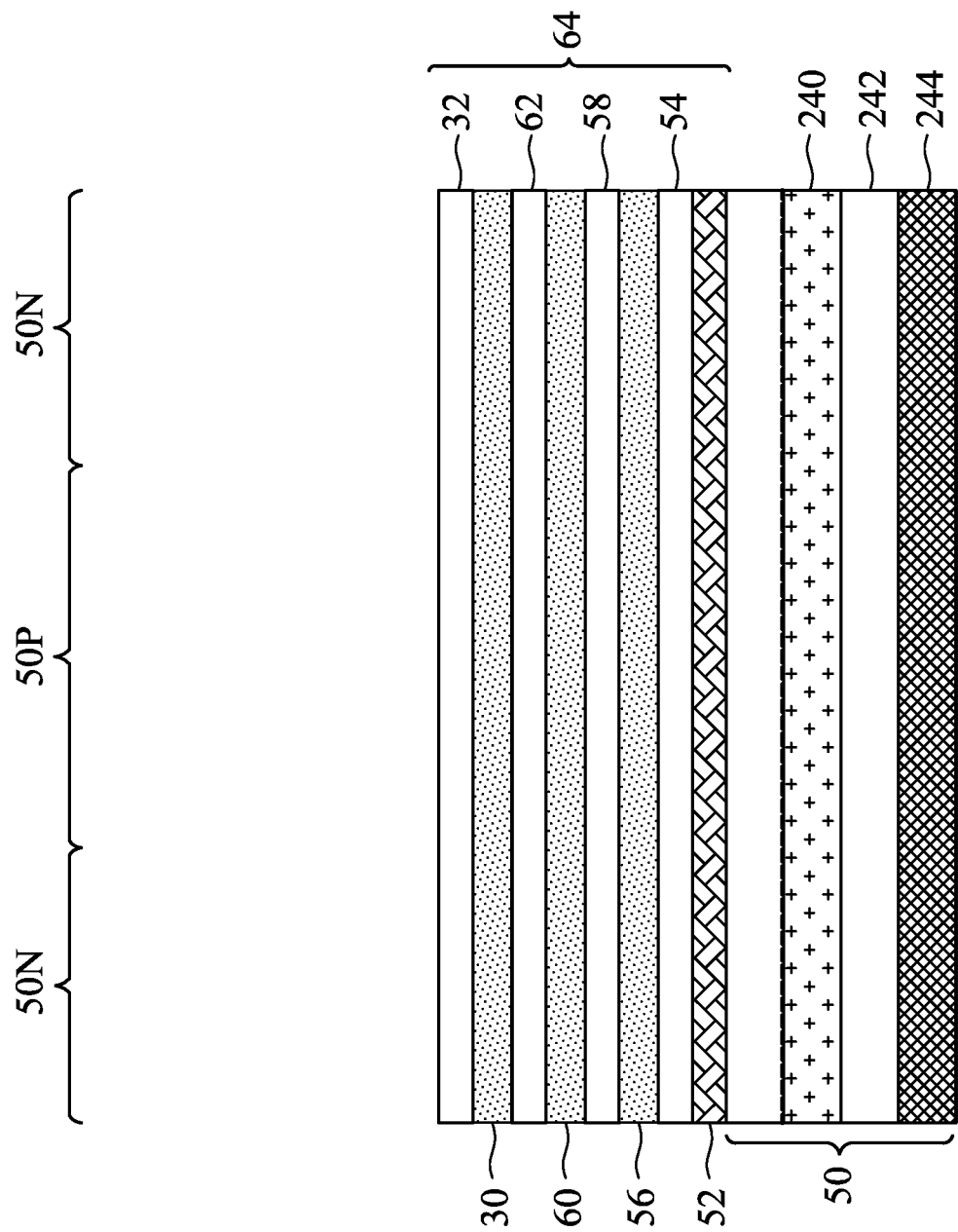
FIGS. 2, 3, 4, 5, 6A, 6B, 7, 8, 9, 10, 11, 12, 13, 14, 15A, 15B, 15C, 16A, 16B, 17A, 17B, 18A, 18B, 19A, 19B, 20A, 20B, 21, 22A, 22B, 23A, 23B, 24, 25, 26, 27, 28, 29, 30A, 30B, 31, and 32 are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has regions 50N and a region 50P. The regions 50N can be for forming n-type devices, such as NMOS transistors, e.g., n-type nano-FETs. The region 50P can be for forming p-type devices, such as PMOS transistors, e.g., p-type nano-FETs. The region 50N may be physically separated from the region 50P, and any number of device features (e.g., other active devices, doped regions, isolation structures, etc.) may be disposed between the regions 50N and the region 50P. Although two regions 50N and one region 50P are illustrated, any number of regions 50N and regions 50P may be provided.

The substrate 50 may comprise a heavily doped p-type region 244, a lightly doped p-type region 242 over the heavily doped p-type region 244, and a silicon-germanium layer 240 over the lightly doped p-type region 242. The silicon-germanium layer 240 may be epitaxially grown using a process such as chemical vapor deposition (CVD), atomic layer deposition (ALD), vapor phase epitaxy (VPE), molecular beam epitaxy (MBE), or the like.

Further in FIG. 2, a multi-layer stack 64 is formed over the substrate 50. The multi-layer stack 64 includes a sacrificial layer 52, a channel layer 54, a sacrificial layer 56, a channel layer 58, a sacrificial layer 60, a channel layer 62, a sacrificial layer 30 and a channel layer 32. However, in other embodiments, the multi-layer stack 64 may include any number of channel layers and sacrificial layers. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, alternating layers of the multi-layer stack 64 may be formed of first semiconductor materials (e.g., silicon (Si), silicon carbon (SiC), or the like) or second semiconductor materials (e.g., silicon germanium (SiGe) or the like). For example, sacrificial layer 52, sacrificial layer 56, sacrificial layer 60 and sacrificial layer 30 may be formed of the second semiconductor material and channel layer 54, channel layer 58, channel layer 62 and channel layer 32 may be formed of the first semiconductor material. In other embodiments, sacrificial layer 52, sacrificial layer 56, sacrificial layer 60 and sacrificial layer 30 may be formed of the first semiconductor material and the channel layer 54, channel layer 58, channel layer 62 and channel layer 32 may be formed of the second semiconductor material. The first semiconductor materials and the second semiconductor materials may be materials having high etch selectivity to one another. As such, the layers of the multi-layer stack 64 including the first semiconductor material may be removed without removing the layers including the second semiconductor material and the layers of the multi-layer stack 64 including the second semiconductor material may be removed without removing the layers including the first semiconductor material. In an embodiment in which sacrificial layer 30, sacrificial layer 52, sacrificial layer 56, and sacrificial layer 60 comprise the second semiconductor material (e.g., SiGe), a concentration of Ge in each of these sacrificial layers 30, 52, 56, and 50 range from about 10% to about 50%.

The channel layers (e.g., channel layer 54, channel layer 58, channel layer 62, and channel layer 32) may have thicknesses different from thicknesses of the sacrificial layers. For example, sacrificial layer 52 may have a thickness from about 6 nm to about 20 nm. The channel layers may have thicknesses from about 6 nm to about 15 nm. A ratio of the thicknesses of the channel layers to the thickness of sacrificial layer 52 may be from about 1.25 to about 2.5. As will be discussed in greater detail below, including the channel layers and the sacrificial layers having the pre-scribed thicknesses allows for a dielectric layer (such as dielectric layer 110, discussed below with respect to FIG. 13) to fill a gap left by removing sacrificial layer 52 and allows for gate dielectric layers 96 and a gate electrode (such as the gate electrodes 98, discussed below with respect to FIGS. 19A and 19B) to fill gaps left by removing sacrificial layer 56, sacrificial layer 60, and sacrificial layer 30. The dielectric layer is used to isolate gates and the channel layers of the nano-FETs from the substrate 50, which prevents gate to power rail short circuiting.

Figure 3:
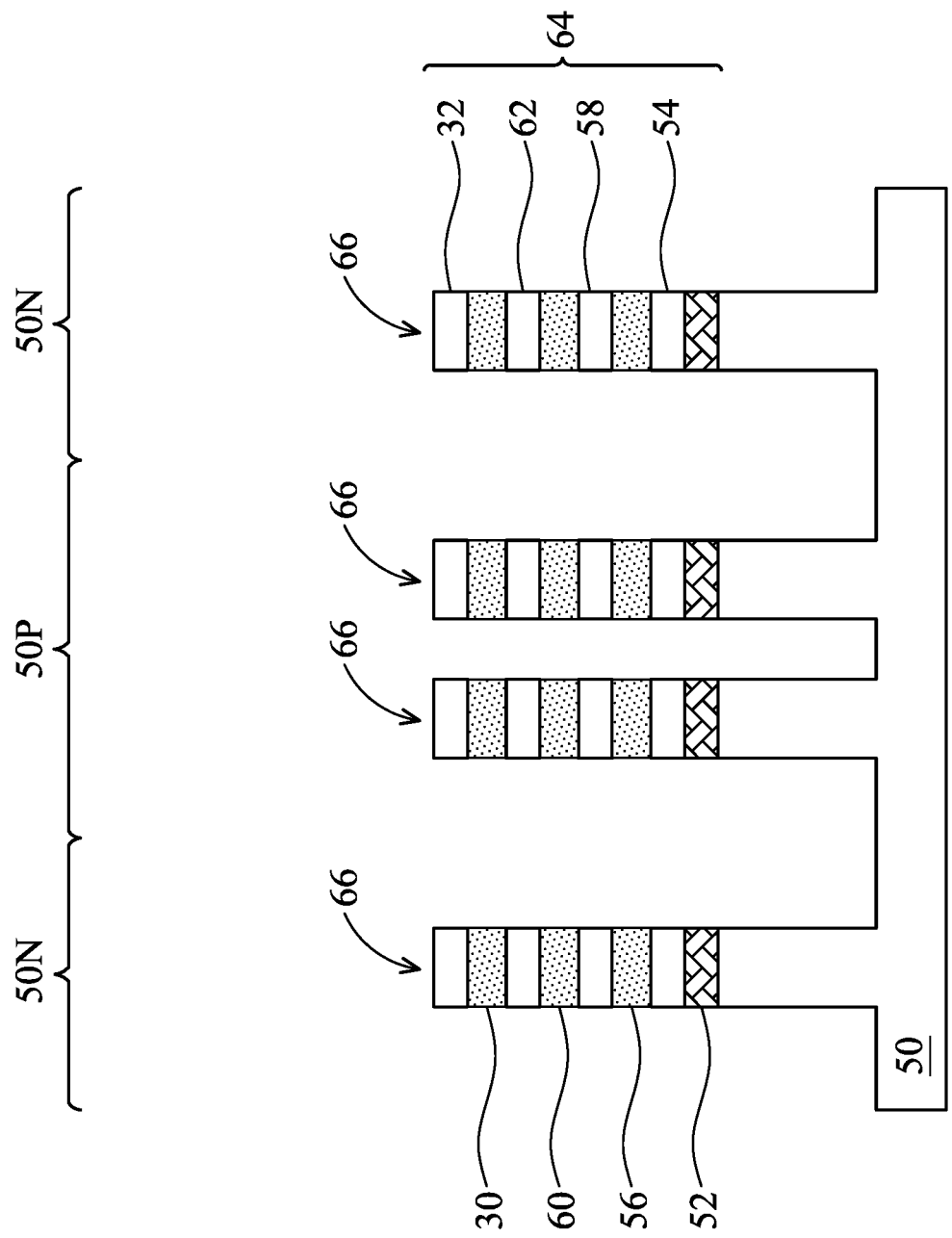

In FIG. 3, fins 66 are formed in the multi-layer stack 64 and the substrate 50. The fins 66 may be semiconductor strips. In some embodiments, the fins 66 may be formed in the multi-layer stack 64 and the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic.

The fins 66 may be patterned by any suitable method. For example, the fins 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

Figure 4:
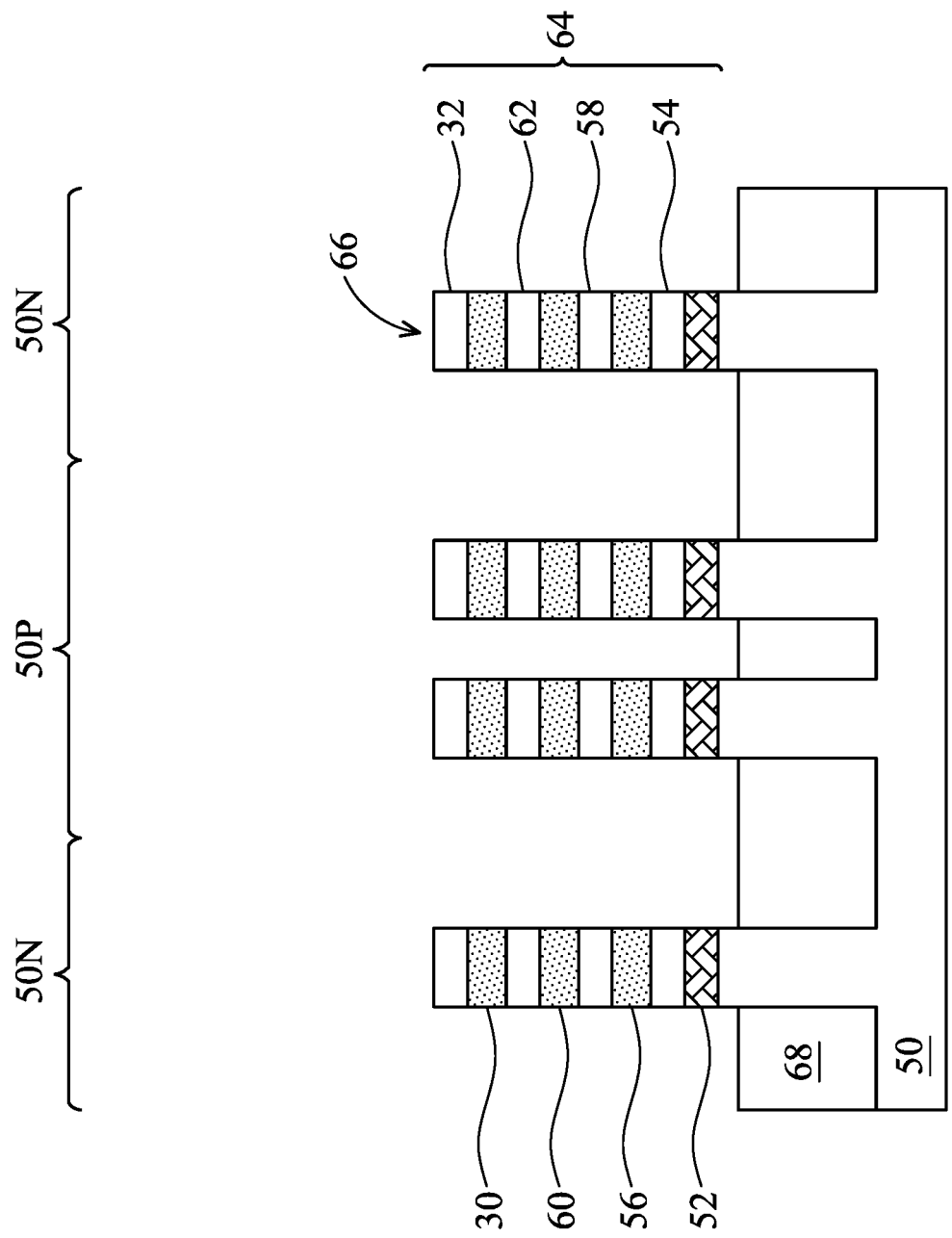

In FIG. 4, shallow trench isolation (STI) regions 68 are formed adjacent the fins 66. The STI regions 68 may be formed by depositing an insulation material over the substrate 50 and the fins 66 and between the fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 66. Although the insulation material is illustrated as a single layer, some embodiments may utilize multiple layers. For example, in some embodiments a liner (not separately illustrated) may first be formed along a surface of the substrate 50 and the fins 66. Thereafter, a fill material, such as those discussed above may be formed over the liner.

A removal process is then applied to the insulation material to remove excess insulation material over the fins 66. In some embodiments, a planarization process such as a chemical mechanical polish (CMP), an etch-back process, combinations thereof, or the like may be utilized. The planarization process exposes the fins 66 such that top surfaces of the fins 66 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66). For example, an oxide removal using, for example, dilute hydrofluoric (dHF) acid may be used.

The process described with respect to FIGS. 2 through 4 is just one example of how the fins 66 may be formed. In some embodiments, the fins 66 may be formed by an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the regions 50N (e.g., the NMOS regions) different from the material in the region 50P (e.g., the PMOS region). In various embodiments, the layers of the multi-layer stacks 64 of the fins 66 may be formed from silicon-germanium ($Si_xGe_{1-x}$ where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the fins 66 and/or the substrate 50. In some embodiments, P wells may be formed in the regions 50N, and an N well may be formed in the region 50P. P wells or N wells may be formed in either of the regions 50N and the region 50P.

In embodiments with different well types, different implant steps for the regions 50N and the region 50P may be achieved using a photoresist or other masks (not separately illustrated). For example, a photoresist may be formed over the fins 66 and the STI regions 68 in the regions 50N. The photoresist is patterned to expose the region 50P of the substrate 50. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the regions 50N. The n-type impurities may be phosphorus, arsenic, antimony, or the like implanted in the region to a concentration of equal to or less than $10^{18}$ atoms/cm$^3$, such as from about $10^{16}$ atoms/cm$^3$ to about $10^{18}$ atoms/cm$^3$. After the implant, the photoresist is removed, such as by an acceptable ashing process.

Following the implanting of the region 50P, a photoresist is formed over the fins 66 and the STI regions 68 in the region 50P. The photoresist is patterned to expose the regions 50N of the substrate 50. The photoresist can be formed by using a spin-on technique and can be patterned using acceptable photolithography techniques. Once the photoresist is patterned, a p-type impurity implant may be performed in the regions 50N, and the photoresist may act as a mask to substantially prevent p-type impurities from being implanted into the region 50P. The p-type impurities may be boron, boron fluoride, indium, or the like implanted in the region to a concentration of equal to or less than $10^{18}$ atoms/cm$^3$, such as from about $10^{16}$ atoms/cm$^3$ to about $10^{18}$ atoms/cm$^3$. After the implant, the photoresist may be removed, such as by an acceptable ashing process.

After the implants of the regions 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
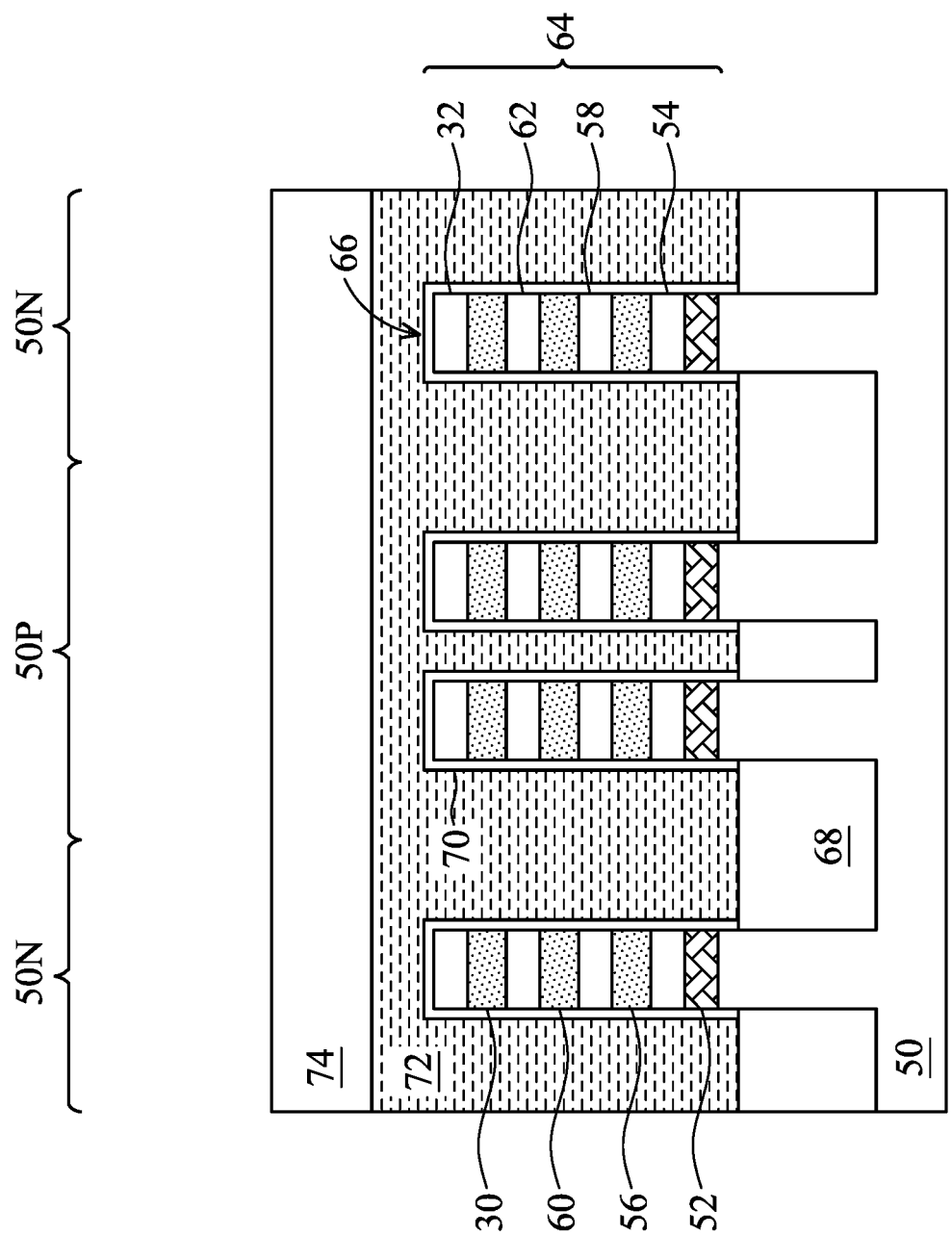

In FIG. 5, a dummy dielectric layer 70 is formed on the fins 66. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques known and used in the art for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the regions 50N and the region 50P. It is noted that the dummy dielectric layer 70 is shown covering only the fins 66 for illustrative purposes only. In some embodiments, the dummy dielectric layer 70 may be deposited such that the dummy dielectric layer 70 covers the STI regions 68, extending between the dummy gate layer 72 and the STI regions 68.

FIGS. 6A through 29, and 32 illustrate various additional steps in the manufacturing of embodiment devices. The structures illustrated in FIGS. 6B, 7, 8, 9, 10, 11, 12, 13, 14, 15A, 15B, 15C, 16B, 17B, 18B, 19B, 20B, 22B, 23B, 24, 25, 26, 27, 28, 29, 31, and 32 illustrate features that may be applicable to both the regions 50N and the region 50P. Any differences in the structures of the regions 50N and the region 50P are described in the text accompanying each figure.

Figure 6A:
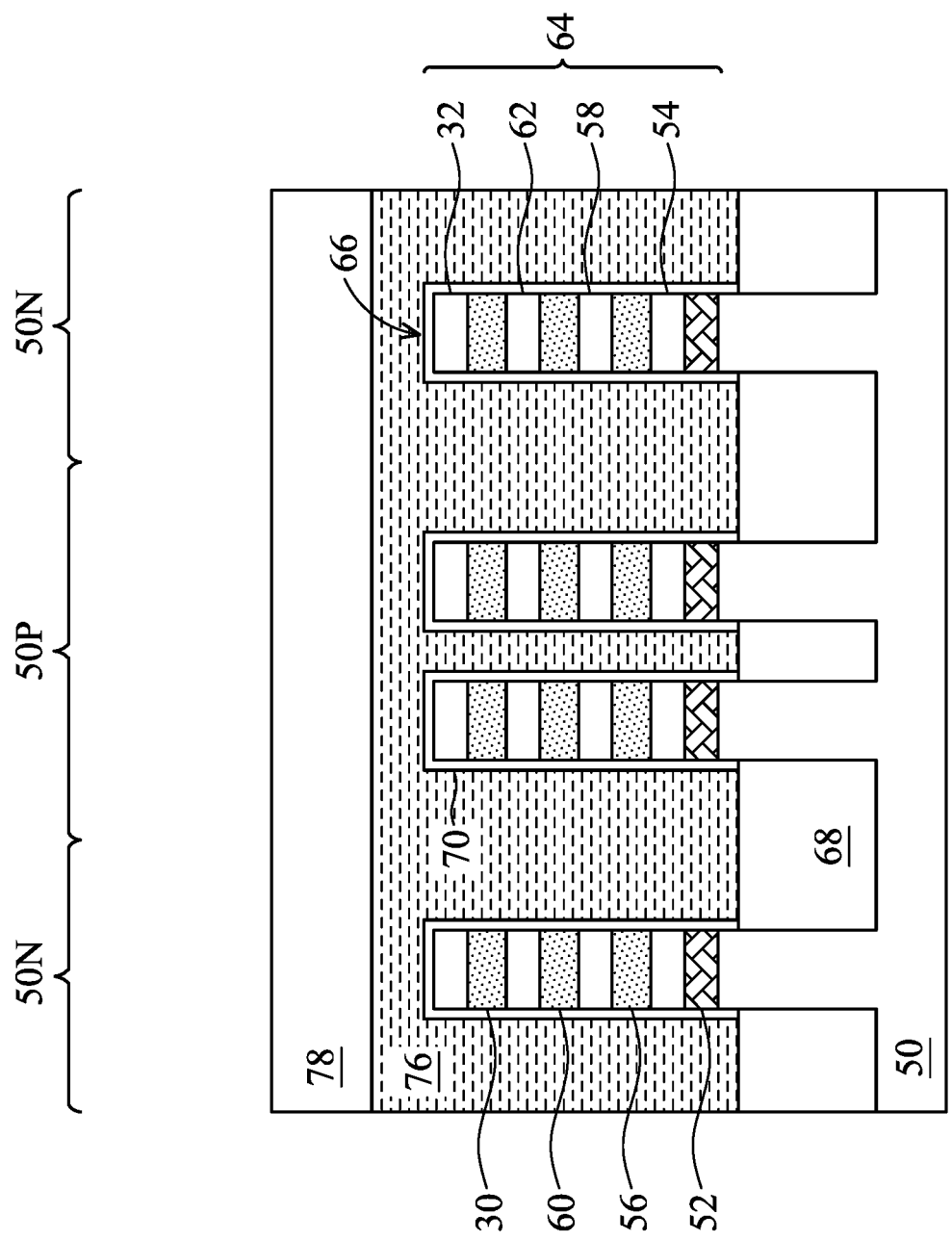
Figure 6B:
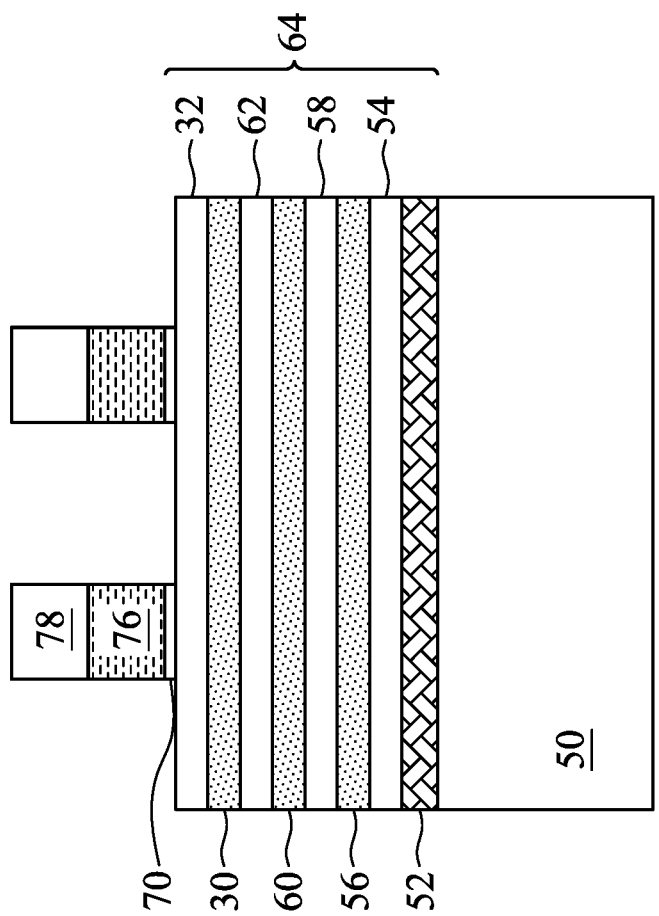

In FIGS. 6A and 6B, the mask layer 74 (see FIG. 5) may be patterned using acceptable photolithography and etching techniques to form masks 78. The pattern of the masks 78 then may be transferred to the dummy gate layer 72. In some embodiments (not separately illustrated), the pattern of the masks 78 may also be transferred to the dummy dielectric layer 70 by an acceptable etching technique to form dummy gates 76. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7:
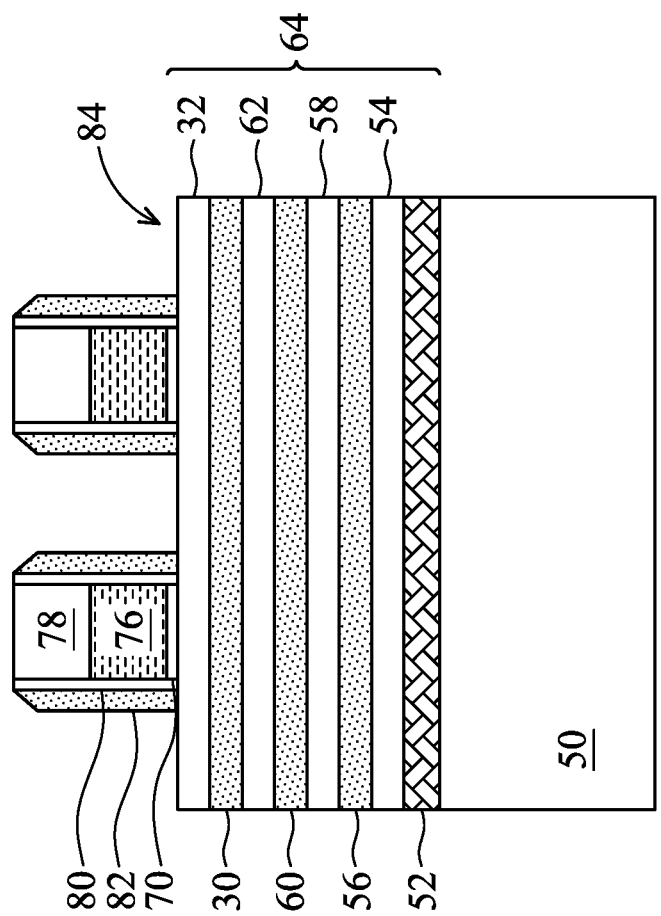

In FIG. 7, gate seal spacers 80 are be formed on exposed surfaces of the dummy gates 76, the masks 78, and/or the fins 66. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not separately illustrated) may be performed. In the embodiments with different device types, similar to the implants discussed above in FIG. 4, a mask, such as a photoresist, may be formed over the regions 50N, while exposing the region 50P, and appropriate type (e.g., p-type) impurities may be implanted into the exposed fins 66 in the region 50P. The mask may then be removed. Subsequently, a mask, such as a photoresist, may be formed over the region 50P while exposing the regions 50N, and appropriate type impurities (e.g., n-type) may be implanted into the exposed fins 66 in the regions 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ atoms/cm$^3$ to about $10^{19}$ atoms/cm$^3$. An anneal may be used to repair implant damage and to activate the implanted impurities.

Further in FIG. 7, gate spacers 82 are formed on the gate seal spacers 80 along sidewalls of the dummy gates 76 and the masks 78. The gate spacers 82 may be formed by conformally depositing an insulating material and subsequently anisotropically etching the insulating material. The insulating material of the gate spacers 82 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 82, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 8:
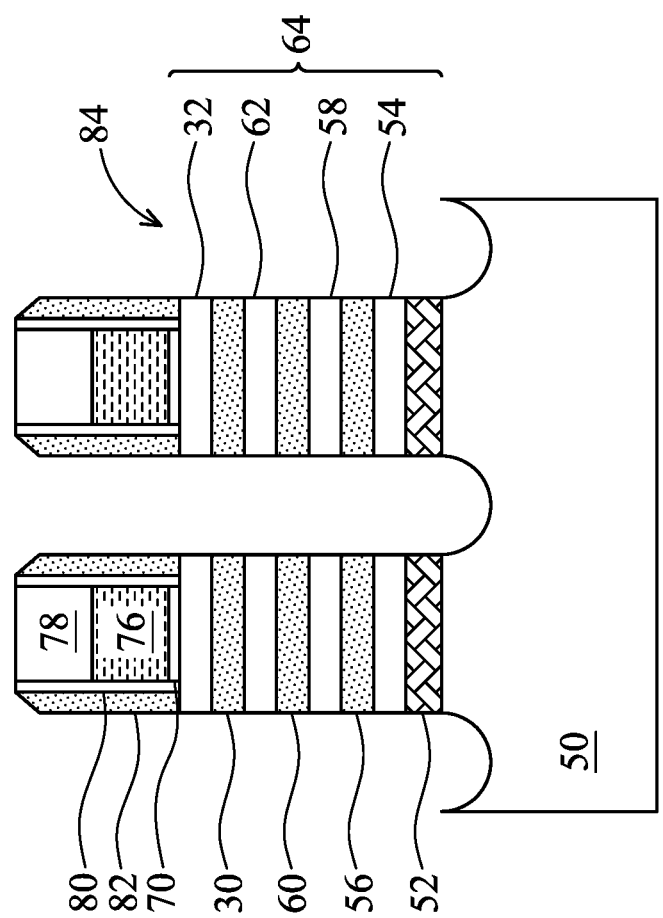

In FIG. 8, recesses 84 are formed in the fins 66 in both regions 50N and region 50P. As illustrated in FIG. 8, the recesses 84 extend through channel layer 32, sacrificial layer 30, channel layer 62, sacrificial layer 60, channel layer 58, sacrificial layer 56, channel layer 54, and sacrificial layer 52. The recesses 84 extend into the bulk portion of substrate 50.

The recesses 84 may be formed by etching the fins 66 using anisotropic etching processes, such as RIE, NBE, or the like. The gate spacers 82, the gate seal spacers 80, and the masks 78 mask portions of the fins 66 during the etching processes used to form the recesses 84. A single etch process may be used to etch each of channel layer 32, sacrificial layer 30, channel layer 62, sacrificial layer 60, channel layer 58, sacrificial layer 56, channel layer 54, and sacrificial layer 52. In other embodiments, multiple etch processes may be used to etch the layers of the multi-layer stack 64. Timed etch processes may be used to stop the etching of the recesses 84. In alternate embodiments of the present disclosure the etched layers of the multi-layer stack 64 may each have a trapezoid shape such that a bottom surface of each of the channel layer 32, sacrificial layer 30, channel layer 62, sacrificial layer 60, channel layer 58, sacrificial layer 56, channel layer 54, and sacrificial layer 52 has a larger width than a corresponding top surface of each of the channel layer 32, sacrificial layer 30, channel layer 62, sacrificial layer 60, channel layer 58, sacrificial layer 56, channel layer 54, and sacrificial layer 52. The trapezoid shape of the channel layer 32, channel layer 62, channel layer 58, and channel layer 54 is shown subsequently in FIG. 31. In addition, widths of each of the channel layer 32, sacrificial layer 30, channel layer 62, sacrificial layer 60, channel layer 58, sacrificial layer 56, channel layer 54, and sacrificial layer 52 may decrease progressively with each layer in a direction away from the substrate 50.

Figure 9:
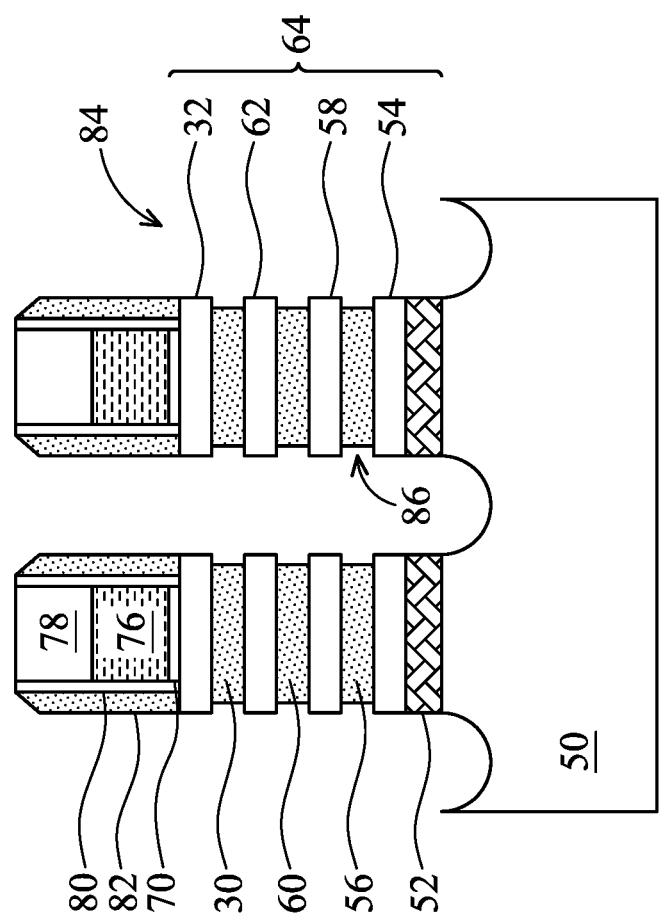

In FIG. 9, portions of the sidewalls of the layers of the multi-layer stack 64 exposed by the recesses 84 are etched to form sidewall recesses 86. The sidewalls may be etched using isotropic etching processes, such as wet etching or the like. As illustrated in FIG. 9, sidewalls of sacrificial layer 30, sacrificial layer 60, and sacrificial layer 56 may be etched in the regions 50N and the region 50P.

The etchants used to etch sacrificial layer 30, sacrificial layer 60, and sacrificial layer 56 may be selective to the materials of channel layer 32, channel layer 62, channel layer 58, channel layer 54, and the sacrificial layer 52. In an embodiment in which sacrificial layer 30, sacrificial layer 60, and sacrificial layer 56 comprise the second semiconductor material (e.g., SiGe) and channel layer 32, channel layer 62, channel layer 58, and channel layer 54 comprise the first semiconductor material (e.g., Si or SiC), tetramethylammonium hydroxide (TMAH), ammonium hydroxide (NH$_4$OH), or the like may be used to etch sidewalls of the multi-layer stack 64 in regions 50N and 50P. Sacrificial layer 52 may also comprise the second semiconductor material (e.g., SiGe), and may have a germanium concentration lower than a germanium concentration of sacrificial layer 30, sacrificial layer 60, and sacrificial layer 56. For example, the sacrificial layer 52 may have a germanium concentration from about $10^{10}$ atoms/cm$^3$ to about $10^{15}$ atoms/cm$^3$, and sacrificial layer 30, sacrificial layer 60, and sacrificial layer 56 may have a germanium concentration from about $10^{20}$ atoms/cm$^3$ to about $10^{35}$ atoms/cm$^3$. A germanium concentration of sacrificial layer 52 being lower than a germanium concentration of sacrificial layer 30, sacrificial layer 60, and sacrificial layer 56 results in the etchants used to etch sacrificial layer 30, sacrificial layer 60, and sacrificial layer 56 having a higher selectivity to the materials of sacrificial layer 52. As a result, sidewalls of sacrificial layer 52 are etched less than sidewalls of sacrificial layer 30, sacrificial layer 60, and sacrificial layer 56. Consequently, sacrificial layer 52 is wider than sacrificial layer 30, sacrificial layer 60, and sacrificial layer 56, and sacrificial layer 52 is recessed less from sidewalls of the channel layers 32, 62, 58, and 54 than the sacrificial layers 30, 60, and 56.

In further embodiments, the layers may be etched using a dry etching process. Hydrogen fluoride, another fluorine-based gas, or the like may be used to etch sidewalls of the multi-layer stack 64 in the regions 50N and 50P. Although sacrificial layer 52, channel layer 54, sacrificial layer 56, channel layer 58, sacrificial layer 60, channel layer 62, sacrificial layer 30 and channel layer 32 are illustrated in FIG. 9 as having linear sidewalls adjacent the sidewall recesses 86, the sidewalls may be concave, convex, or the like. Moreover, sidewalls of each of sacrificial layer 52, channel layer 54, sacrificial layer 56, channel layer 58, sacrificial layer 60, channel layer 62, sacrificial layer 30 and channel layer 32 may extend beyond, be recessed from, or be co-terminus with sidewalls of adjacent channel layers and/or sacrificial layers.

Figure 10:
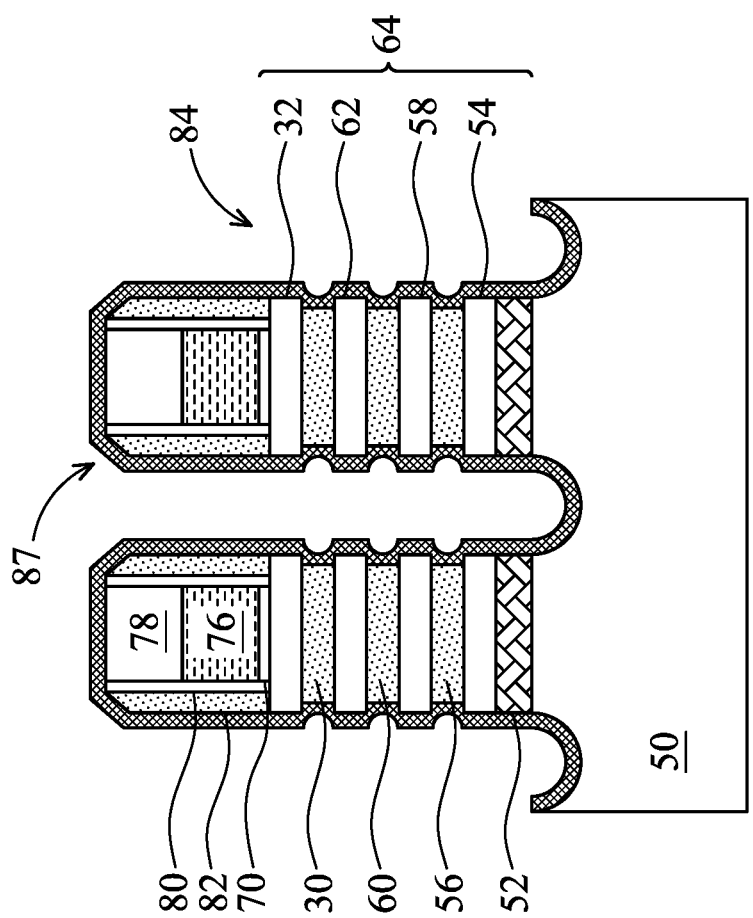

In FIG. 10, an inner spacer layer 87 is deposited over the structures illustrated in FIG. 9. The inner spacer layer may be deposited by a conformal deposition process, such as CVD, ALD, or the like. The inner spacer layer may comprise a material such as silicon nitride or silicon oxynitride, although any suitable material, such as low-k materials having a k-value less than about 3.5, may be utilized.

Figure 11:
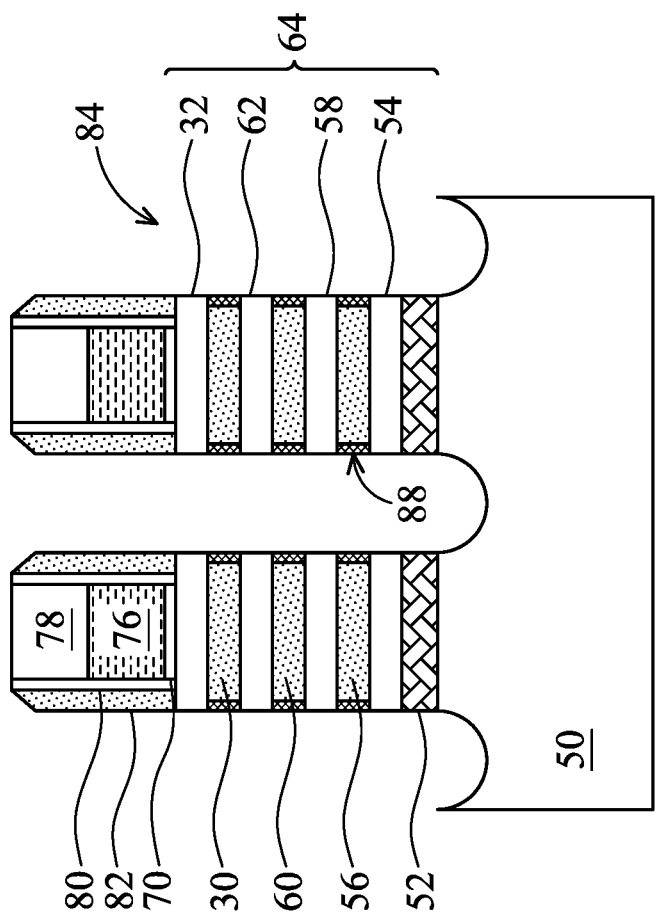

In FIG. 11, inner spacers 88 are formed in the sidewall recess 86 to protect sidewalls of sacrificial layer 30, sacrificial layer 60, and sacrificial layer 56. However, sidewalls of sacrificial layer 52 are left exposed by the inner spacers 88. The inner spacer layer 87 may be etched to form the inner spacers 88. The inner spacer layer 87 may be etched by an anisotropic etching process, such as RIE, NBE, or the like. The inner spacers 88 may be used to protect sidewalls of sacrificial layer 30, sacrificial layer 60, and sacrificial layer 56 during the subsequent removal of sacrificial layer 52 (discussed below with respect to FIG. 12) by a subsequent etching process. The inner spacers 88 may also be used to prevent damage to subsequently formed source/drain regions (such as the epitaxial source/drain regions 90 discussed below with respect to FIG. 15A) by subsequent etching processes. Although the inner spacers 88 are illustrated as having linear sidewalls, the sidewalls of the inner spacers 88 may be convex, concave, or the like. Moreover, sidewalls of the inner spacers 88 adjacent the recesses 84 may extend beyond, be recessed from, or be co-terminus with sidewalls of the channel layers and/or sacrificial layers disposed adjacent and above or below the inner spacers 88.

Figure 12:
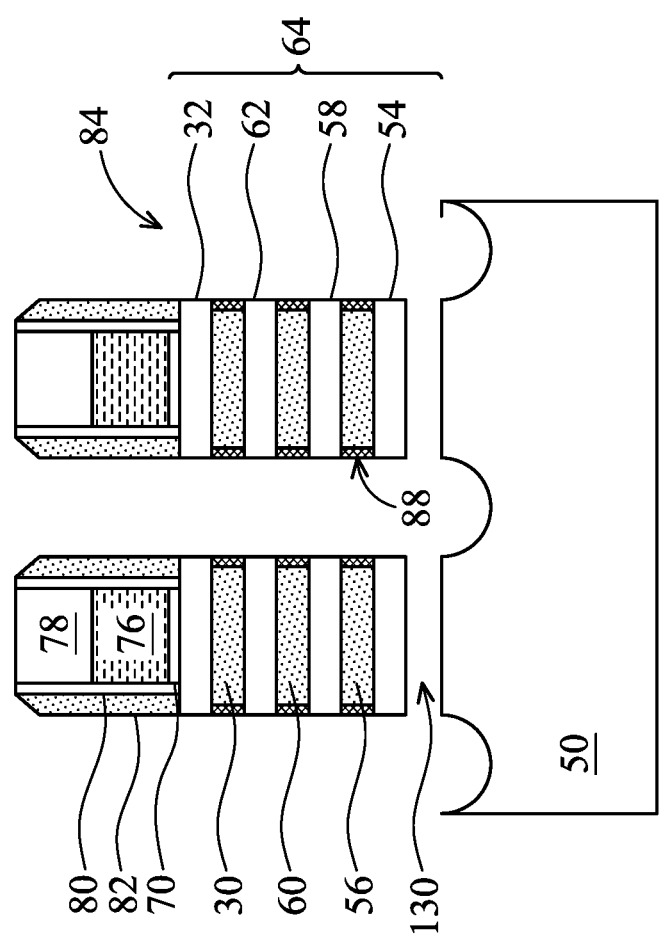

In FIG. 12, the sacrificial layer 52 is removed from the regions 50N and the region 50P to form recesses 130. The sacrificial layer 52 of the multi-layer stack 64 may be removed by isotropic etching processes such as wet etching or the like. The etchants used to etch sacrificial layer 52 may be selective to the materials of channel layer 32, channel layer 62, channel layer 58, and channel layer 54. In an embodiment in which the sacrificial layer 52, comprises the second semiconductor material (e.g., SiGe) and has a germanium concentration lower than a germanium concentration of sacrificial layer 30, sacrificial layer 60, and sacrificial layer 56, and channel layer 32, channel layer 62, channel layer 58, and channel layer 54 comprise the first semiconductor material (e.g., Si or SiC), tetramethylammonium hydroxide (TMAH), ammonium hydroxide (NH$_4$OH), or the like may be used remove sacrificial layer 52 in the regions 50N and region 50P.

Figure 13:
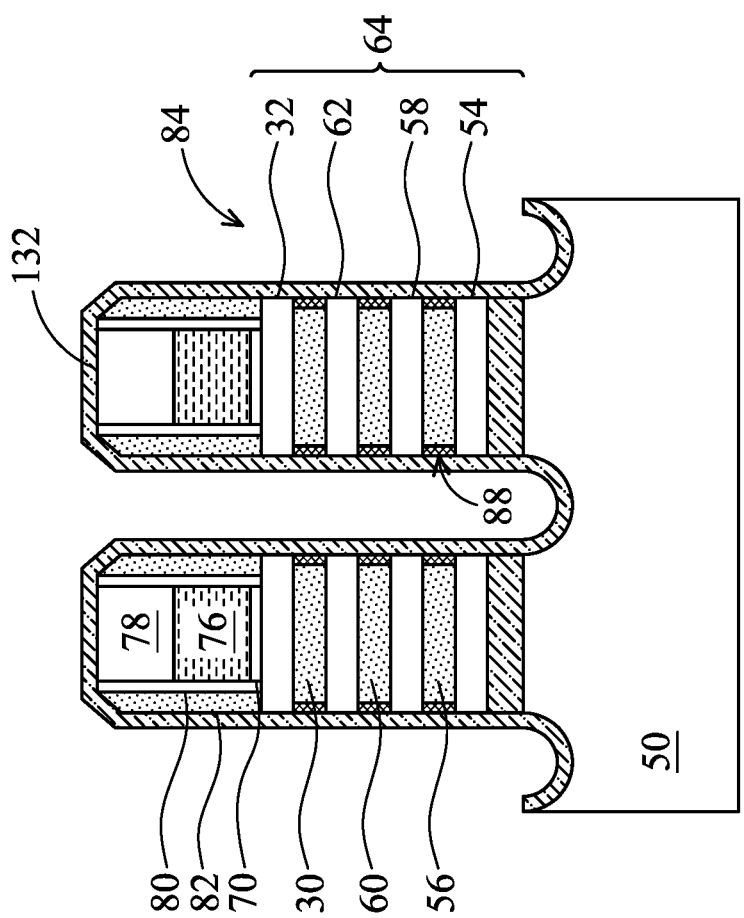

In FIG. 13, a dielectric layer 132 is deposited in recesses 130 and over the structures illustrated in FIG. 12 using a conformal deposition process, such as CVD, ALD, or the like. The dielectric layer may comprise a material such as silicon oxide, silicon nitride, silicon carbon nitride, silicon carbon oxynitride, metal oxide (e.g., aluminum oxide or zirconium oxide), combinations thereof, or the like. The dielectric layer 132 fills the recesses 130 formed by the removal of sacrificial layer 52 as shown in FIG. 12.

Figure 14:
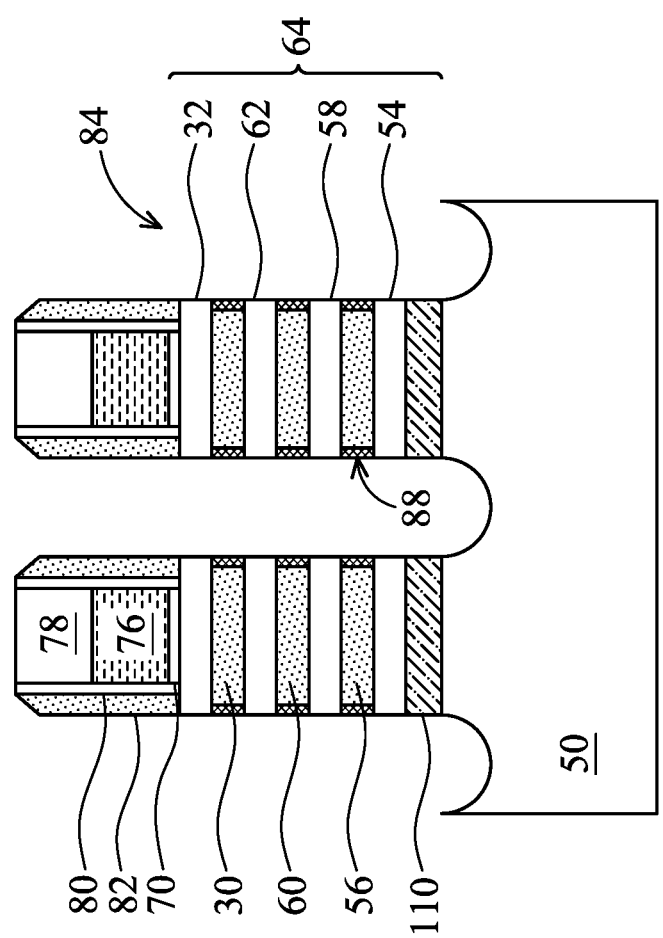

In FIG. 14, a dielectric layer 110 is formed by etching portions of the dielectric layer 132. Dielectric layer 132 may be etched using isotropic etching processes, such as wet etching or the like. Although the dielectric layer 110 is illustrated as having linear sidewalls, the sidewalls of the dielectric layer 110 may be convex, concave, or the like. Moreover, sidewalls of the dielectric layer 110 adjacent the recesses 84 may extend beyond, be recessed from, or be co-terminus with sidewalls of the channel layers or sacrificial layers disposed above the dielectric layer 110. The dielectric layer 110 may have a thickness from about 6 nm to about 20 nm, in some embodiments. It has been observed that providing a dielectric layer 110 in this range has advantages. For example, providing a thinner dielectric layer 110 may lead to insufficient isolation being provided by the dielectric layer 110 between the channel layers of the nano-FETs and the substrate 50. This insufficient isolation may cause gate to power rail short circuiting. Providing a thicker dielectric layer 110 may require an inefficiently thick dielectric layer 132 to be deposited (discussed above with respect to FIG. 13) to fill in recesses 130, increasing manufacturing costs and reducing yield.

As illustrated in FIG. 14, the dielectric layer 110 may extend between the substrate 50 and the channel layer 54.

The dielectric layer 110 is used to isolate subsequently formed gates and the channel layers, (e.g., the channel layer 54, channel layer 58, channel layer 62, and channel layer 32) of the nano-FETs from the substrate 50, which prevents short circuiting between the gates and a subsequently formed power rail 124 (discussed below with respect to FIG. 29).

Figure 15A:
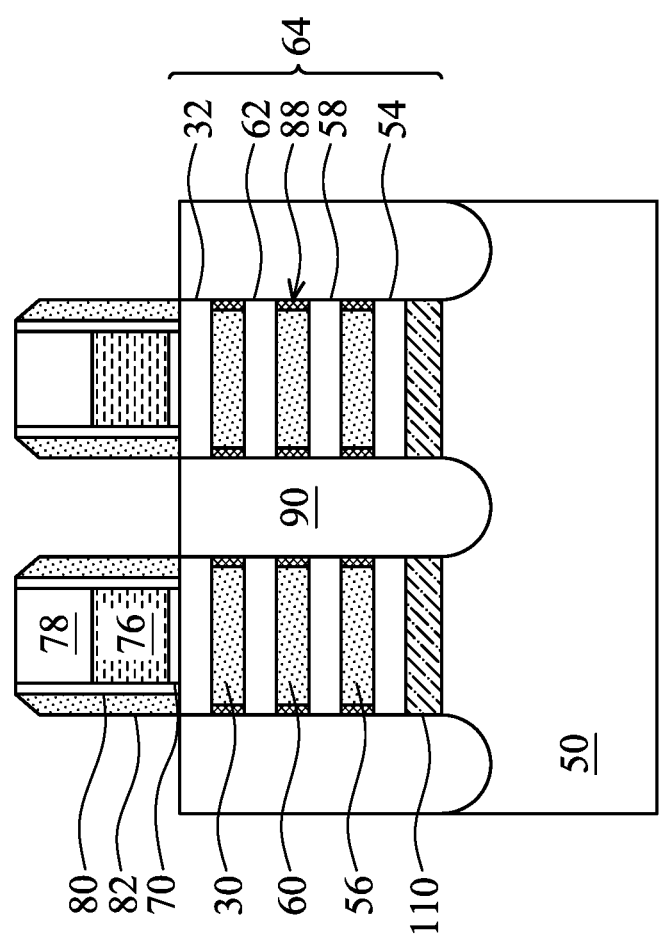
Figure 15C:
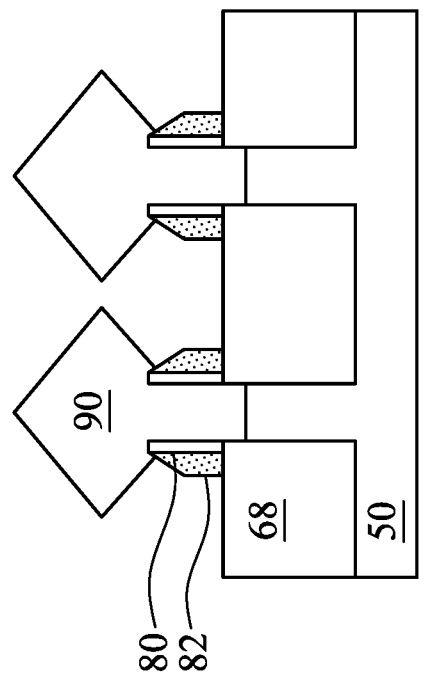
Figure 15B:
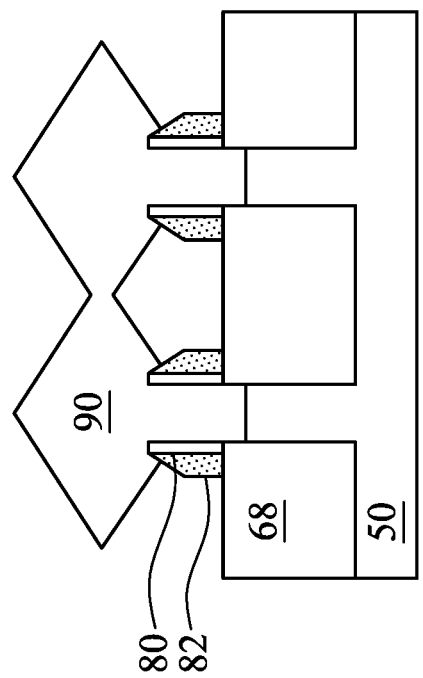

In FIGS. 15A-15C epitaxial source/drain regions 90 are formed in the recesses 84 in the regions 50N and region 50P. The epitaxial source/drain regions 90 are formed in the recesses 84, such that each dummy gate 76 is disposed between respective neighboring pairs of the epitaxial source/drain regions 90. In some embodiments, the gate spacers 82 are used to separate the epitaxial source/drain regions 90 from the dummy gates 76 by an appropriate lateral distance so that the epitaxial source/drain regions 90 do not short out subsequently formed gates of the resulting nano-FETs. The inner spacers 88 may also be used to separate the epitaxial source/drain regions 90 from the dummy gates 76 and to prevent shorts between the epitaxial source/drain regions 90 and subsequently formed gates of the resulting nano-FETs.

The epitaxial source/drain regions 90 may be formed by epitaxially growing any acceptable material, in the recesses 84. The epitaxial source/drain regions 90 in the NMOS regions may include any acceptable material, such as appropriate for n-type nano-FETs. For example, the epitaxial source/drain regions 90 may include materials exerting a tensile strain in the channel layers, such as silicon, silicon carbide, phosphorous doped silicon carbide, silicon phosphide, or the like. The epitaxial source/drain regions 90 in the PMOS regions may include any acceptable material, such as appropriate for p-type nano-FETs. For example, the epitaxial source/drain regions 90 may include materials exerting a compressive strain in the channel layers, such as silicon-germanium, boron doped silicon-germanium, germanium, germanium tin, or the like. The epitaxial source/drain regions 90 may have surfaces raised from respective surfaces of the multi-layer stack 64 and may have facets. In some embodiments, a material of the epitaxial source/drain regions 90 may also be selected to exert a desired stress on the channel layers of the multi-layer stack 64, thereby improving performance. For example, it has been observed that for n-type nano-FETs, a material that exerts tensile stress may be beneficial while for p-type nano-FETS, a material that exerts compressive stress may be beneficial.

As a result of the epitaxy processes used to form the epitaxial source/drain regions 90 in the regions 50N and the region 50P, upper surfaces of the epitaxial source/drain regions 90 have facets which expand laterally outward beyond sidewalls of the fins 66. In some embodiments, these facets cause adjacent epitaxial source/drain regions 90 of a same nano-FET to merge as illustrated by FIG. 15B. In other embodiments, adjacent epitaxial source/drain regions 90 remain separated after the epitaxy process is completed as illustrated by FIG. 15C. In the embodiments illustrated in FIGS. 15B and 15C, gate spacers 82 and gate seal spacers 80 are formed covering a portion of the sidewalls of the fins 66 that extend above the STI regions 68 thereby blocking the epitaxial growth. In some other embodiments, the spacer etch used to form the gate spacers 82 and the gate seal spacers 80 may be adjusted to remove the spacer material to allow the epitaxially grown region to extend to the surfaces of the STI regions 68.

The epitaxial source/drain regions 90, and/or the multi-layer stack 64 may be implanted with dopants to form source/drain regions, similar to the process previously discussed for forming lightly-doped source/drain regions, followed by an anneal. The source/drain regions may have an impurity concentration from about $10^{19}$ atoms/cm$^3$ to about $10^{21}$ atoms/cm$^3$. The n-type and/or p-type impurities for source/drain regions may be any of the impurities previously discussed. In some embodiments, the epitaxial source/drain regions 90 may be in situ doped during growth.

Figure 16A:
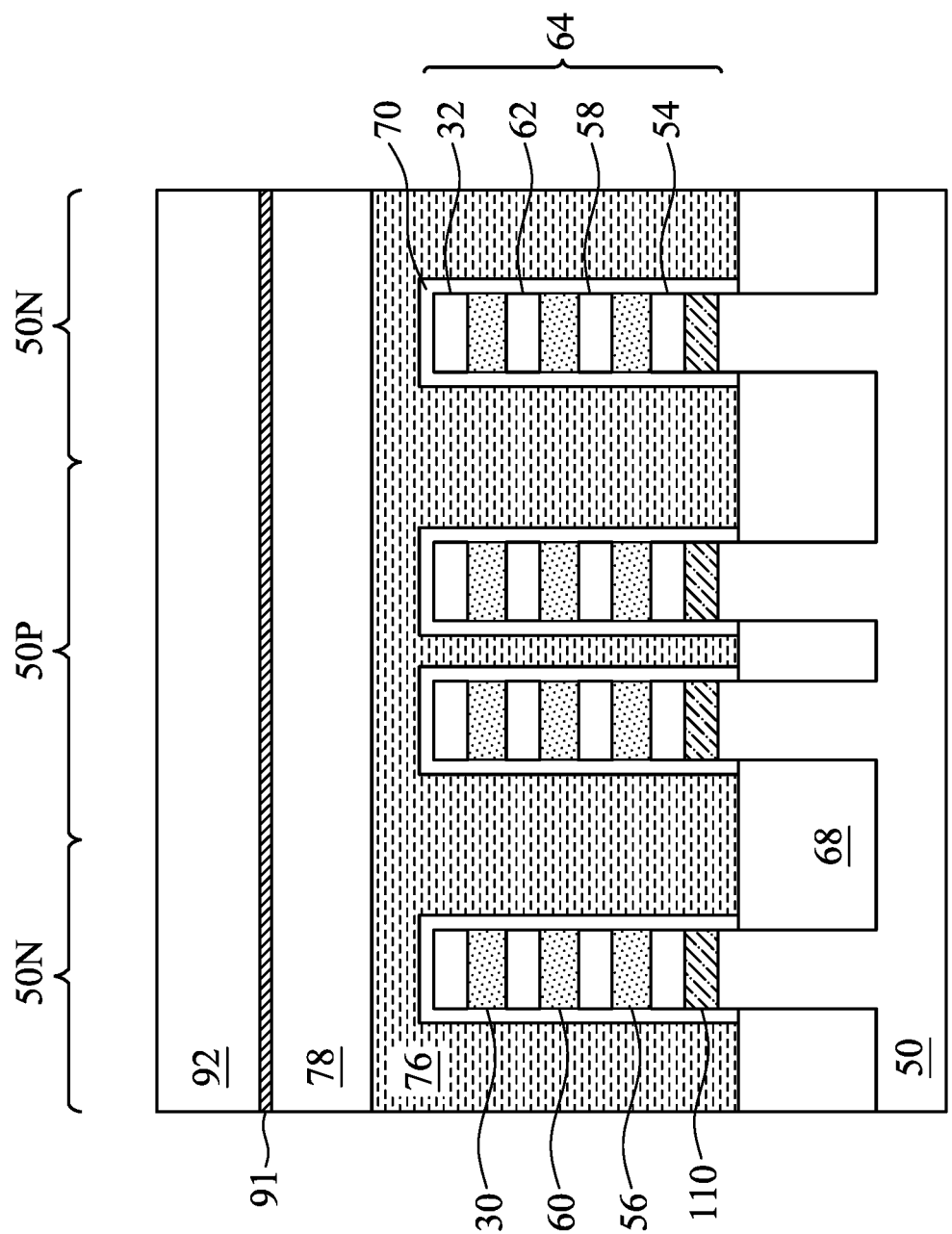
Figure 16B:
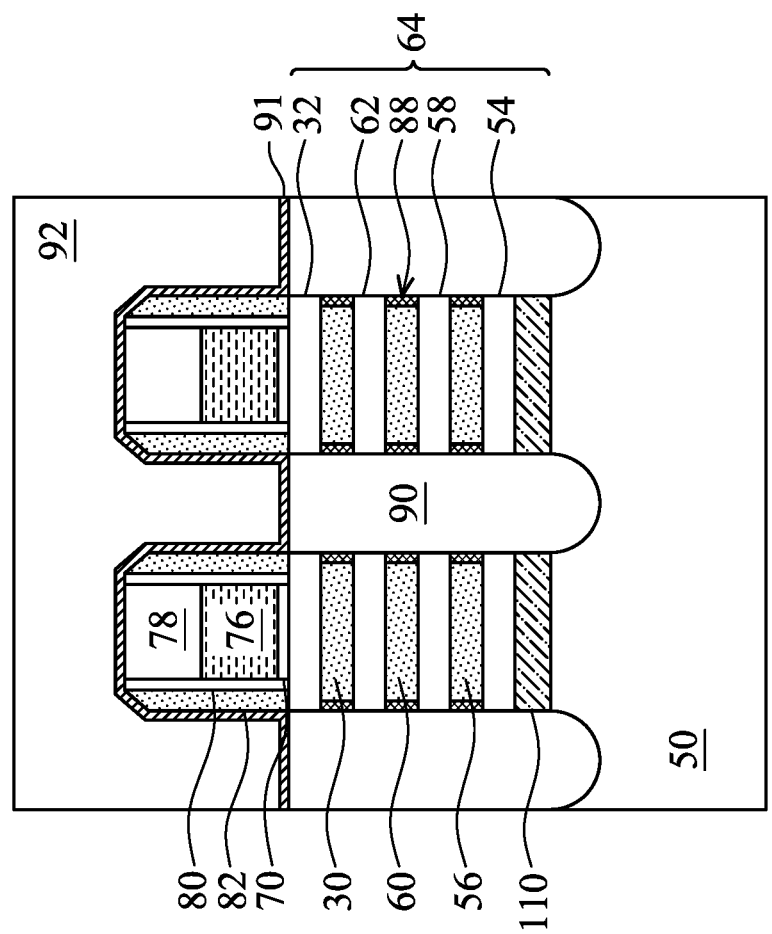

In FIGS. 16A-16B, a first interlayer dielectric (ILD) 92 is deposited over the structure illustrated in FIGS. 15A and 6A. The first ILD 92 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 91 is disposed between the first ILD 92 and the epitaxial source/drain regions 90, the masks 78, and the gate spacers 82. The CESL 91 may comprise a dielectric material, such as, silicon nitride, silicon oxide, silicon oxynitride, or the like, having a different etch rate than the material of the overlying first ILD 92.

Figure 17A:
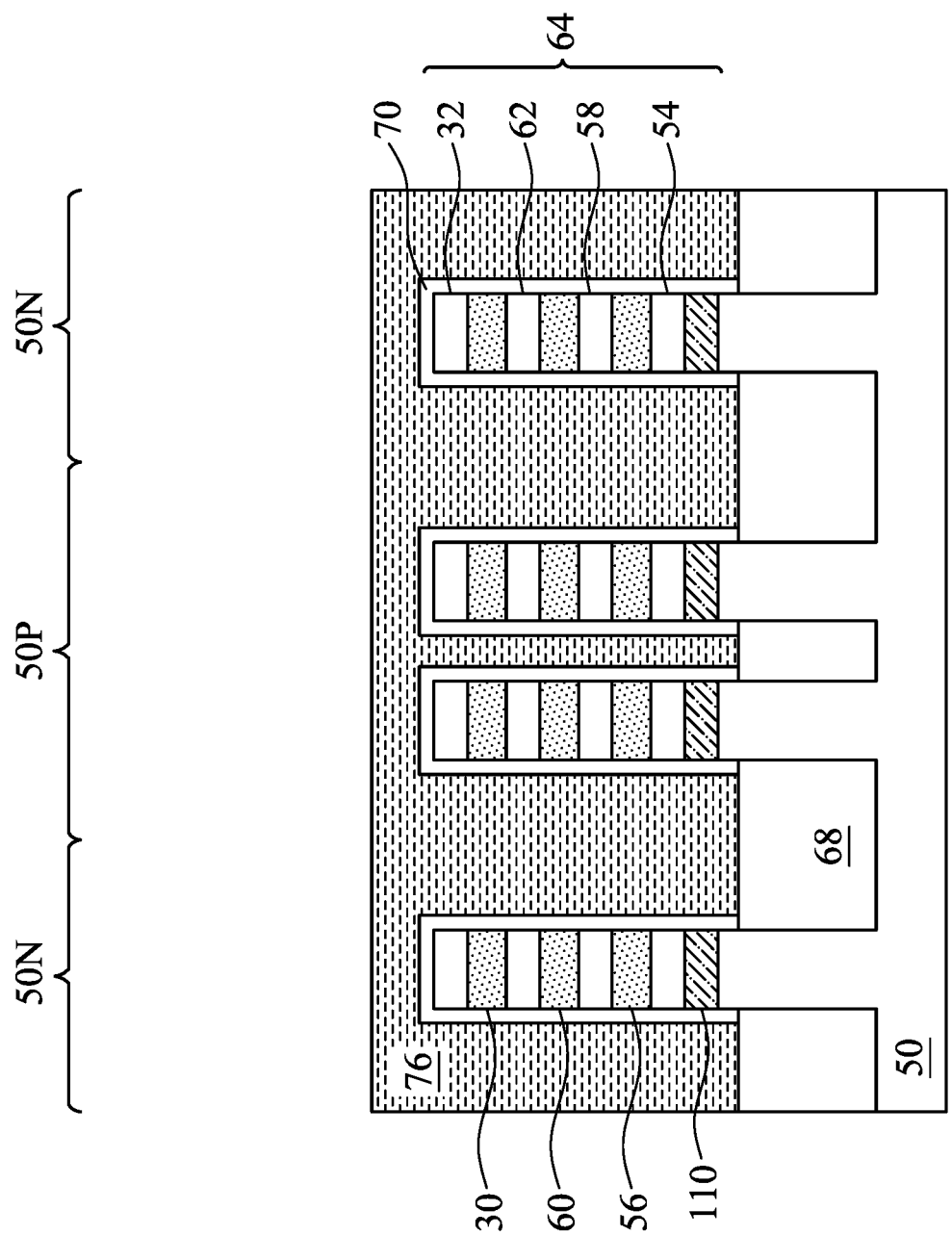
Figure 17B:
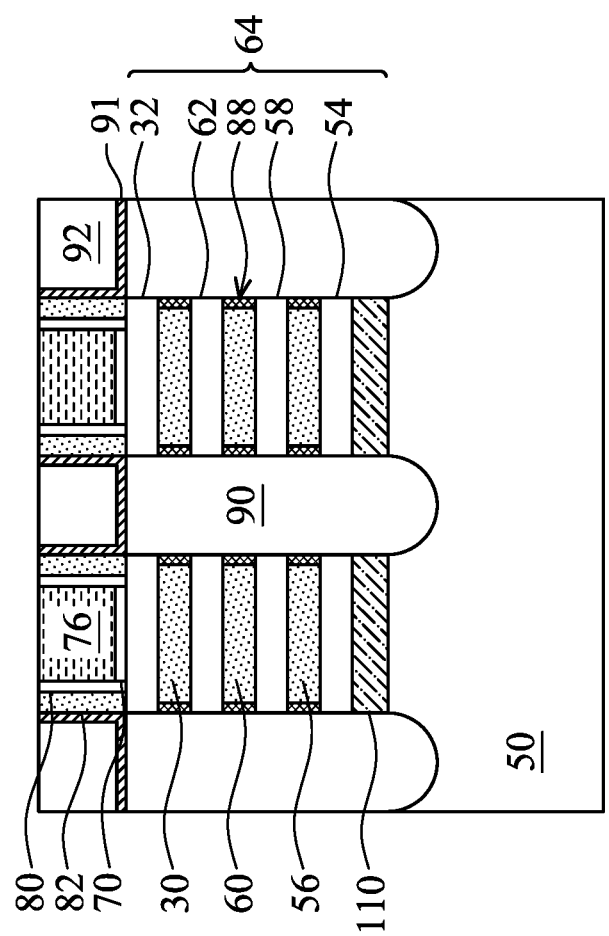

In FIGS. 17A-17B, a planarization process, such as a CMP, may be performed to level the top surface of the first ILD 92 with the top surfaces of the dummy gates 76 or the masks 78. The planarization process may also remove the masks 78 on the dummy gates 76, and portions of the gate seal spacers 80 and the gate spacers 82 along sidewalls of the masks 78. After the planarization process, top surfaces of the dummy gates 76, the gate seal spacers 80, the gate spacers 82, and the first ILD 92 are level. Accordingly, the top surfaces of the dummy gates 76 are exposed through the first ILD 92. In some embodiments, the masks 78 may remain, in which case the planarization process levels the top surface of the first ILD 92 with top surface of the masks 78, the gate seal spacers 80, and the gate spacers 82.

Figure 18A:
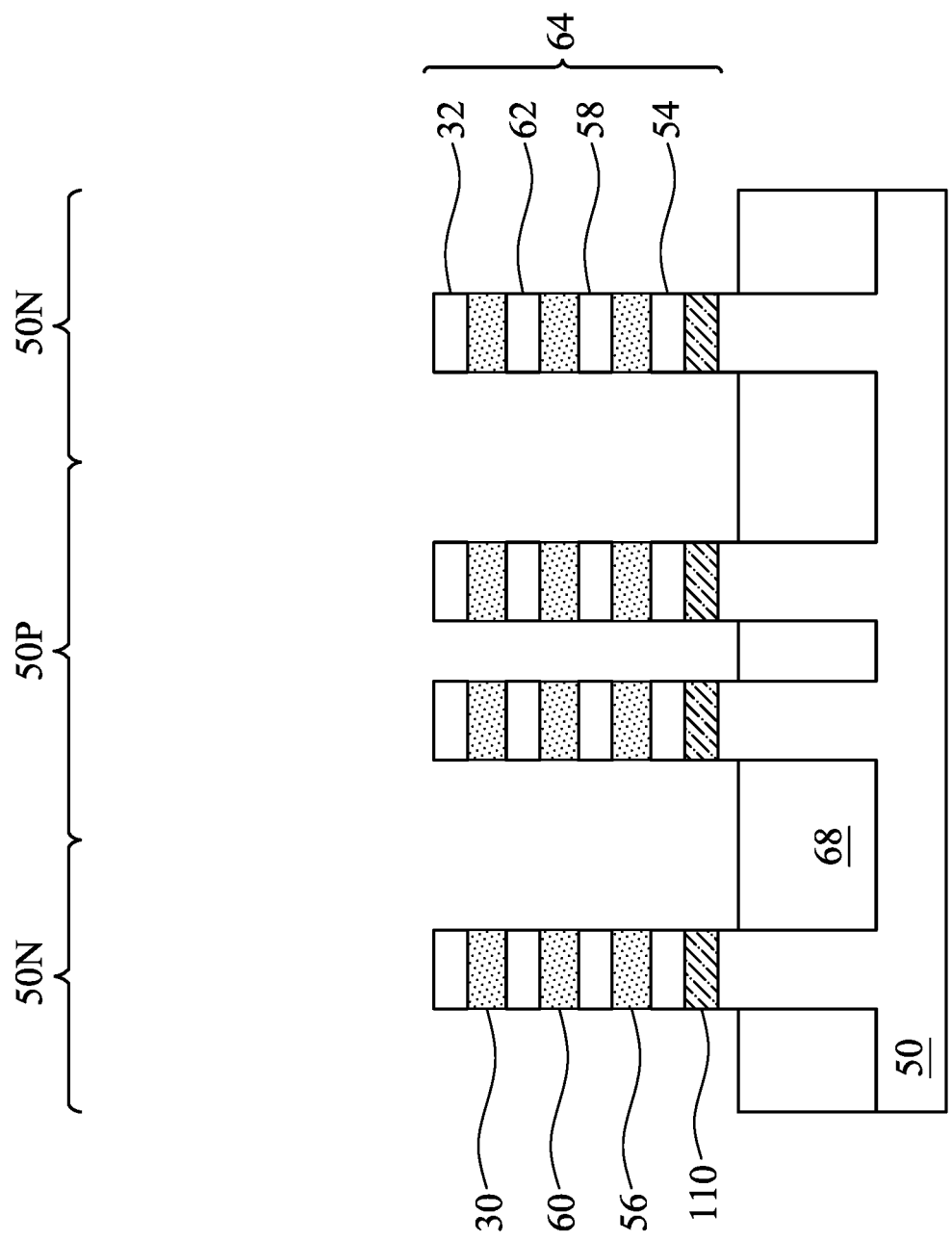
Figure 18B:
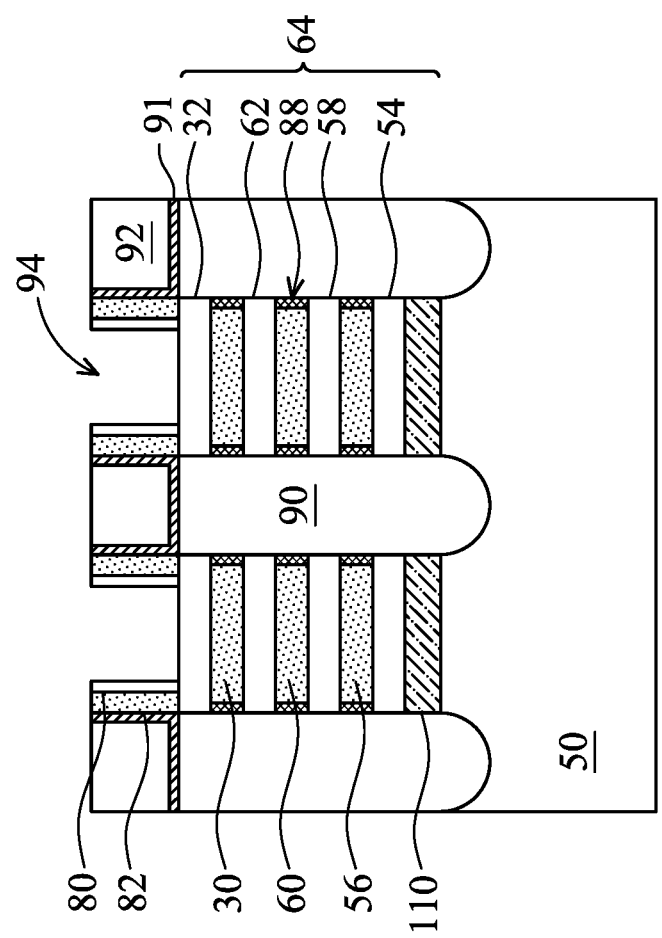

In FIGS. 18A-18B, the dummy gates 76, and the masks 78 if present, are removed in an etching step(s), so that recesses 94 are formed. Portions of the dummy dielectric layer 70 in the recesses 94 may also be removed. In some embodiments, only the dummy gates 76 are removed and the dummy dielectric layer 70 remains and is exposed by the recesses 94. In some embodiments, the dummy dielectric layer 70 is removed from recesses 94 in a first region of a die (e.g., a core logic region) and remains in recesses 94 in a second region of the die (e.g., an input/output region). In some embodiments, the dummy gates 76 are removed by an anisotropic dry etch process. For example, the etching process may include a dry etch process using reaction gas(es) that selectively etch the dummy gates 76 without etching the first ILD 92, the gate seal spacers 80, or the gate spacers 82. Each recess 94 exposes and/or overlies the multi-layer stacks 64. Portions of the multi-layer stacks 64 are disposed between neighboring pairs of the epitaxial source/drain regions 90. During the removal, the dummy dielectric layer 70 may be used as an etch stop layer when the dummy gates 76 are etched. The dummy dielectric layer 70 may then be optionally removed after the removal of the dummy gates 76.

Figure 19A:
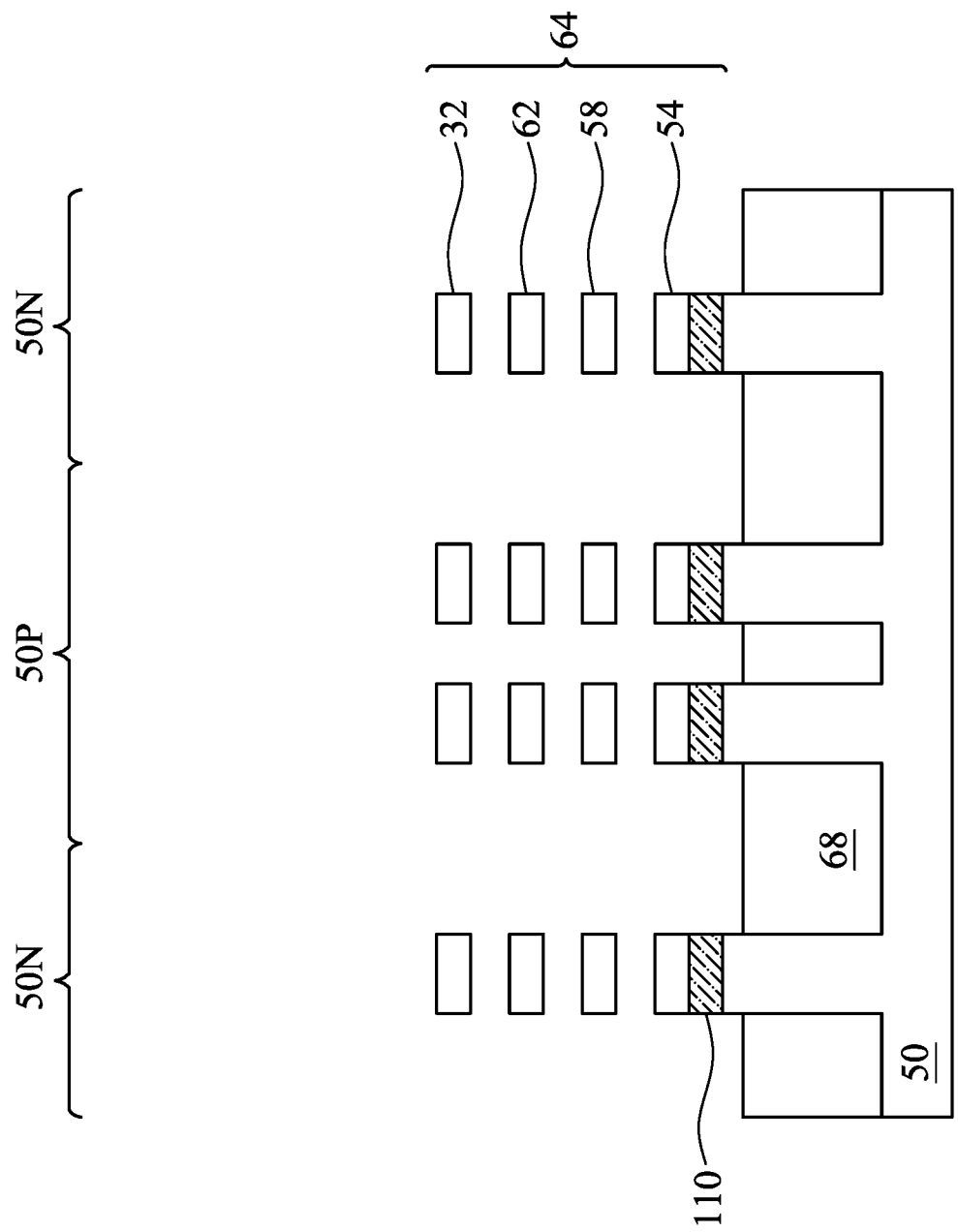
Figure 19B:
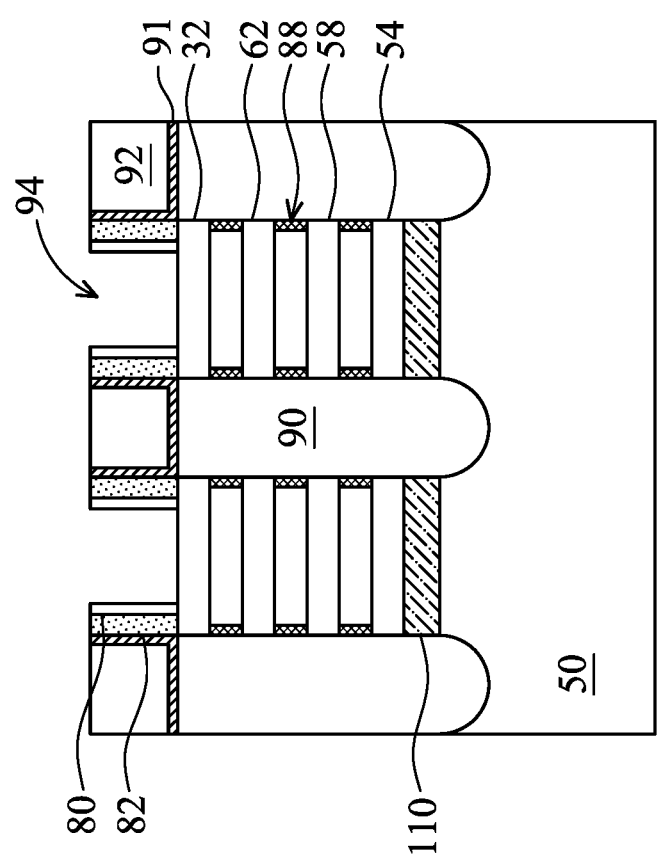

In FIGS. 19A-19B, sacrificial layer 56, sacrificial layer 60, and sacrificial layer 30 are removed from the regions 50N and the region 50P. Sacrificial layer 56, sacrificial layer 60, and sacrificial layer 30 may be removed by isotropic etching processes such as wet etching, dry etching, or the like. The etchants used to remove sacrificial layer 56, sacrificial layer 60, and sacrificial layer 30 may be selective to the materials of dielectric layer 110, channel layer 54, channel layer 58, channel layer 62 and channel layer 32. In an embodiment in which sacrificial layer 56, sacrificial layer 60, and sacrificial layer 30 comprise the second semiconductor material (e.g., SiGe) and the channel layer 54, channel layer 58, channel layer 62 and channel layer 32 comprise the first semiconductor material (e.g., Si or SiC), an fluorine-based etchant, such as, hydrogen fluoride (HF), a fluorine based gas, or the like may be used remove layers of the multi-layer stack 64 in the regions 50N and region 50P.

Figure 20A:
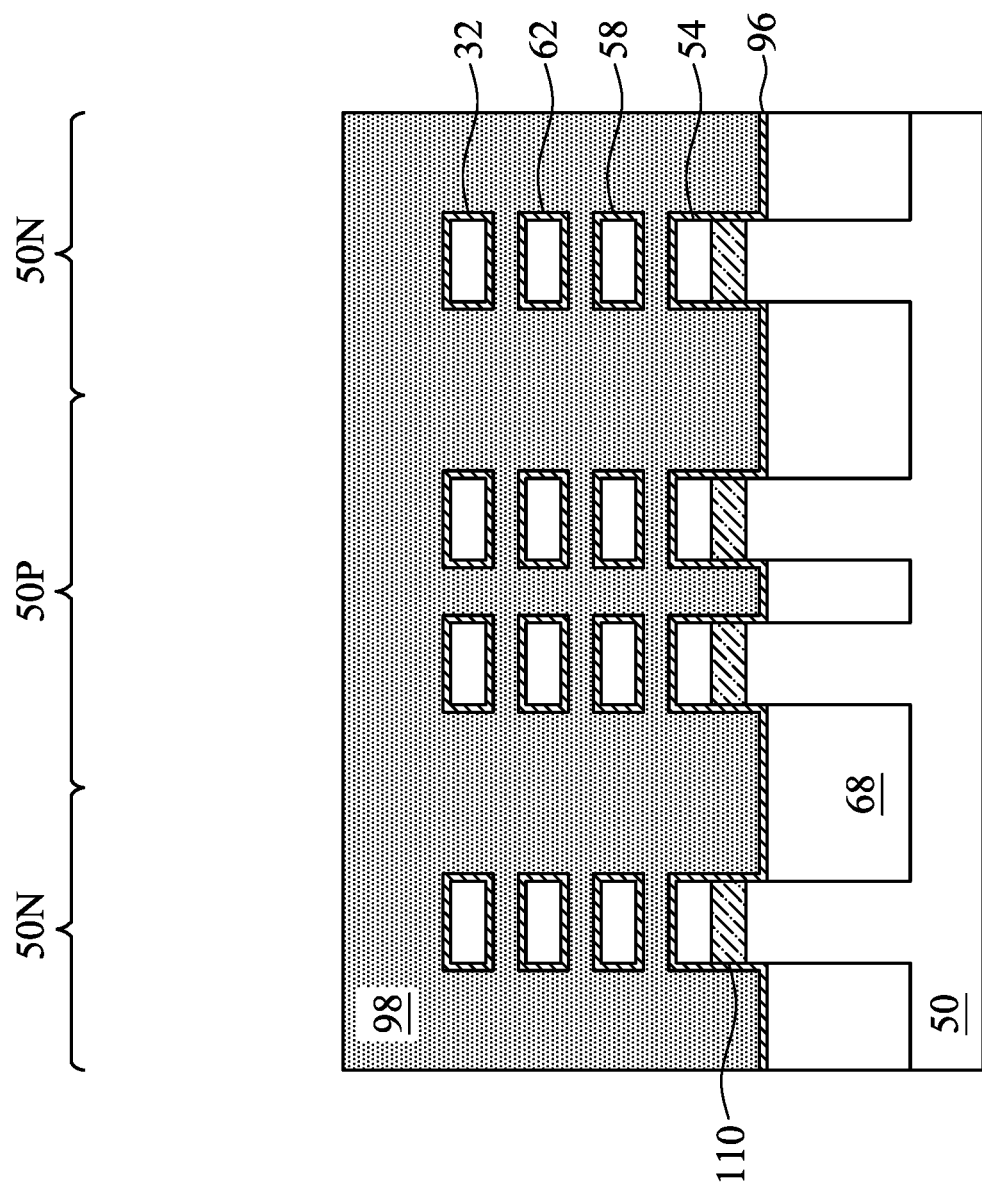
Figure 20B:
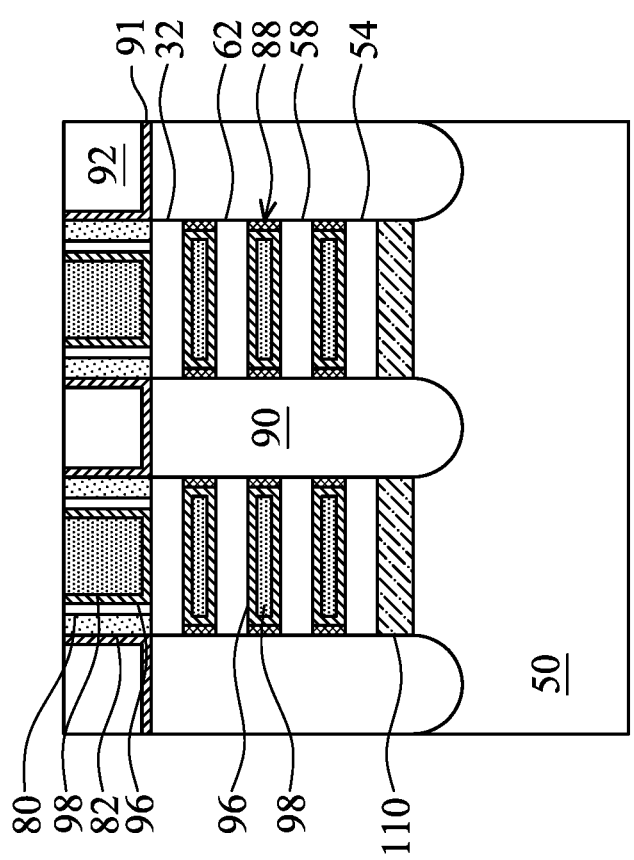
Figure 21:
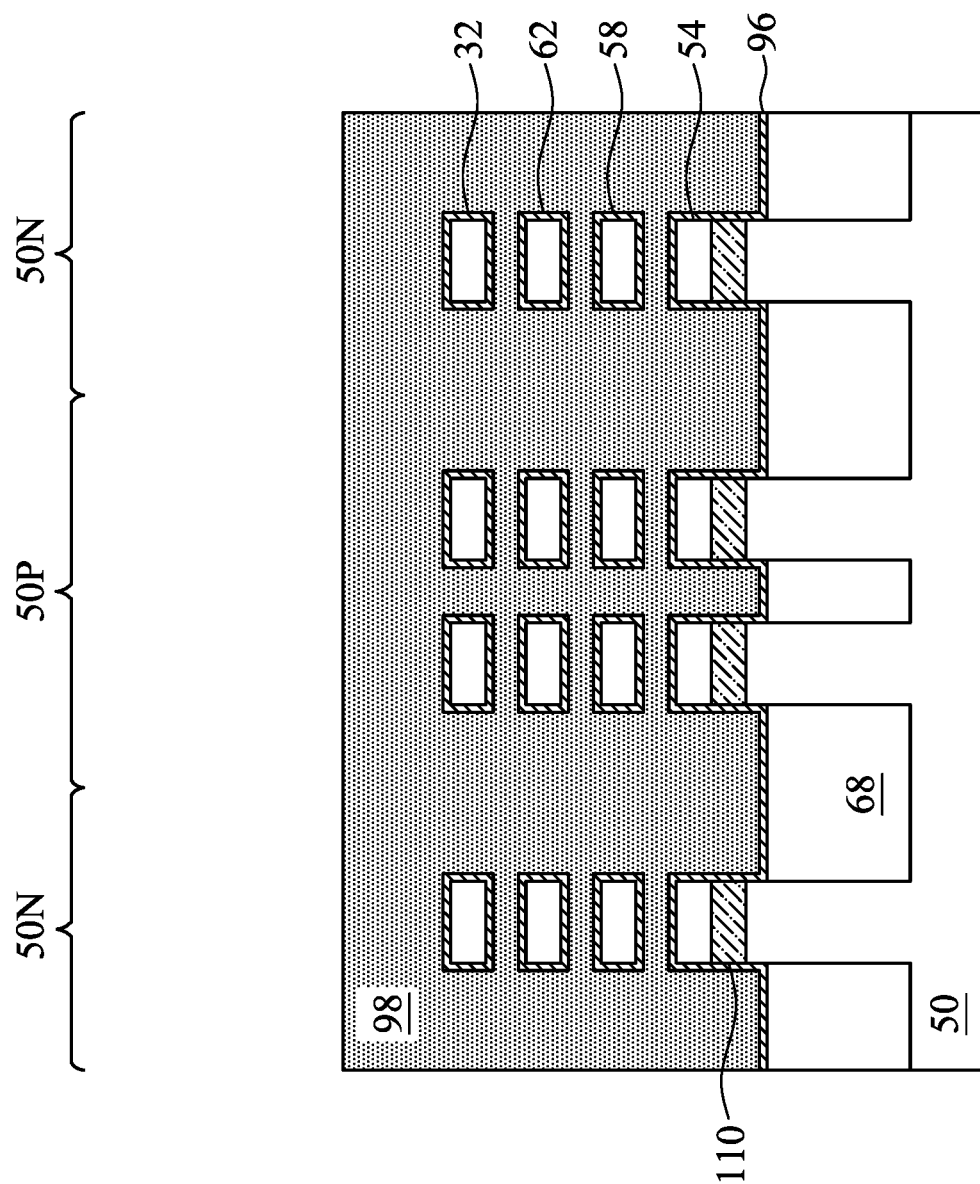

In FIGS. 20A-20B, gate dielectric layers 96 and gate electrodes 98 are formed for replacement gates. The gate dielectric layers 96 are deposited conformally in the recesses 94, such as on sidewalls of the dielectric layer 110, top surfaces and sidewalls of the channel layer 54 and top surfaces, sidewalls, and bottom surfaces of channel layer 58, channel layer 62, and channel layer 32. The gate dielectric layers 96 may also be deposited on top surfaces of the substrate 50, the first ILD 92, the CESL 91, and the STI regions 68, on top surfaces, sidewalls, and bottom surfaces of the gate seal spacers 80, on top surfaces and bottom surfaces of the gate spacers 82, and on sidewalls of the inner spacers 88. In accordance with some embodiments, the gate dielectric layers 96 comprise silicon oxide, silicon nitride, or multilayers thereof. In some embodiments, the gate dielectric layers 96 include a high-k dielectric material, and in these embodiments, the gate dielectric layers 96 may have a k value greater than about 7.0, and may include a metal oxide or a silicate of hafnium, aluminum, zirconium, lanthanum, manganese, barium, titanium, lead, and combinations thereof. The formation methods of the gate dielectric layers 96 may include molecular-beam deposition (MBD), ALD, PECVD, and the like.

The gate electrodes 98 are deposited over the gate dielectric layers 96, respectively, and fill the remaining portions of the recesses 94. The gate electrodes 98 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 98 is illustrated in FIG. 20B, the gate electrodes 98 may comprise any number of liner layers, any number of work function tuning layers, and a fill material. Some or all of the layers making up the gate electrodes 98 may extend between the recesses 94 extending between channel layer 54 and channel layer 58, channel layer 58 and channel layer 62, and channel layer 62 and channel layer 32, depending on the thicknesses of the layers making up the gate electrodes and the spacing of the recesses 94. The gate electrodes 98 may be formed by ALD, CVD, PVD, the like, or combinations thereof. In some embodiments, the gate electrodes 98 may be formed by ALD followed by PVD.

After the filling of the recesses 94, a planarization process, such as a CMP, may be performed to remove the excess portions of the gate dielectric layers 96 and the material of the gate electrodes 98, which excess portions are over the top surface of the first ILD 92. The remaining portions of material of the gate electrodes 98 and the gate dielectric layers 96 thus form replacement gates of the resulting nano-FETs. The gate electrodes 98 and the gate dielectric layers 96 may be collectively referred to as a "gate stack." The gate and the gate stacks may surround each of channel layer 58, channel layer 62, and channel layer 32.

The formation of the gate dielectric layers 96 in the regions 50N and the region 50P may occur simultaneously such that the gate dielectric layers 96 in each region are formed from the same materials, and the formation of the gate electrodes 98 may occur simultaneously such that the gate electrodes 98 in each region are formed from the same materials. In some embodiments, the gate dielectric layers 96 in each region may be formed by distinct processes, such that the gate dielectric layers 96 may be different materials, and/or the gate electrodes 98 in each region may be formed by distinct processes, such that the gate electrodes 98 may be different materials. Various masking steps may be used to mask and expose appropriate regions when using distinct processes.

Although in FIG. 20A, the gate stacks (e.g., the gate dielectric layers 96 and the gate electrodes 98) are illustrated as extending below a bottom surface of the dielectric layer 110, other embodiments may have other configurations. For example, in FIG. 21, a top surface of the STI regions 68 is level with a bottom surface of the dielectric layer 110 and the gate stacks do not extend below a bottom surface of the dielectric layer 110 in accordance with some alternative embodiments. In other embodiments, the top surface of the STI regions 68 may be at a level that is higher than a level of the bottom surface of the dielectric layer 110, and a bottom surface of the gate stacks may likewise be higher than the bottom surface of the dielectric layer 110. Gate dielectric layers 96 and gate electrodes 98 are formed for replacement gates using methods described above in FIG. 20A through 20B.

Figure 22A:
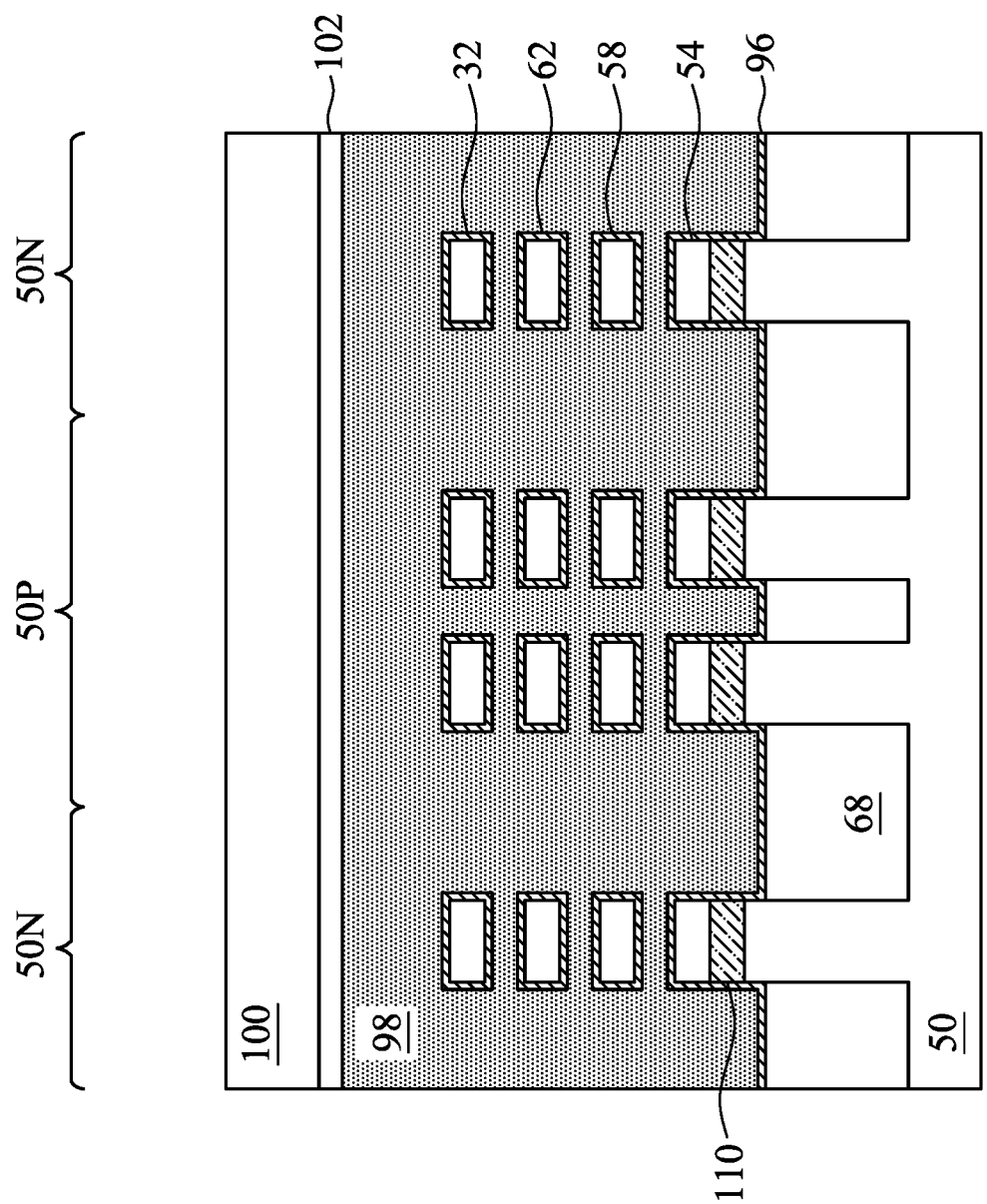
Figure 22B:
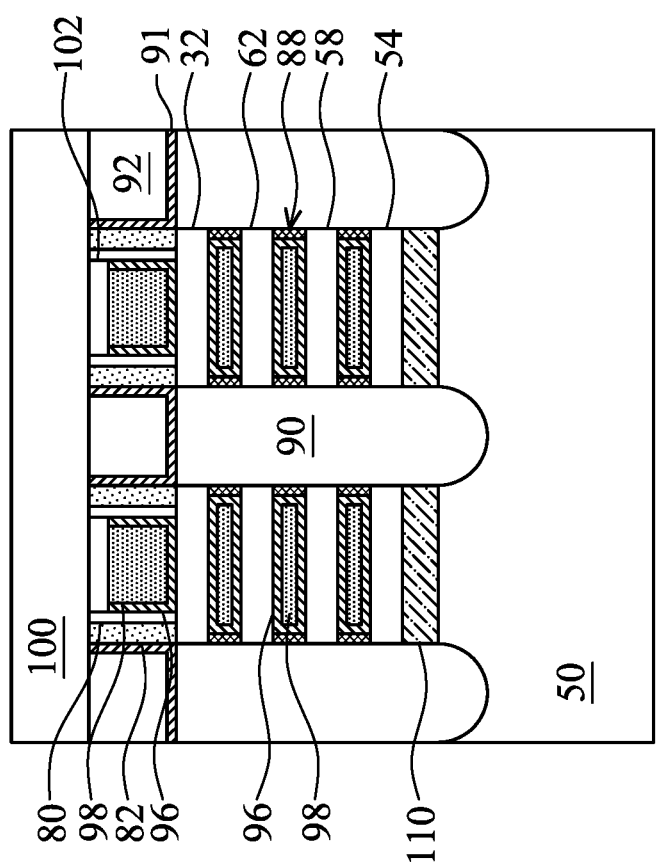

In FIGS. 22A-22B, a second ILD 100 is deposited over the first ILD 92. In some embodiments, the second ILD 100 is a flowable film formed by a flowable CVD method. In some embodiments, the second ILD 100 is formed of a dielectric material such as PSG, BSG, BPSG, USG, or the like, and may be deposited by any suitable method, such as CVD, PECVD, or the like. In accordance with some embodiments, before the formation of the second ILD 100, the gate stack (including the gate dielectric layers 96 and the corresponding overlying gate electrodes 98) is recessed, so that a recess is formed directly over the gate stack and between opposing portions of gate seal spacers 80. A gate mask 102 comprising one or more layers of dielectric material, such as silicon nitride, silicon oxynitride, or the like, is filled in the recess, followed by a planarization process to remove excess portions of the dielectric material extending over the first ILD 92. Subsequently formed gate contacts (such as the gate contacts 104, discussed below with respect to FIGS. 23A-23B) penetrate through the gate mask 102 to contact the top surface of the recessed gate electrodes 98.

Figure 23A:
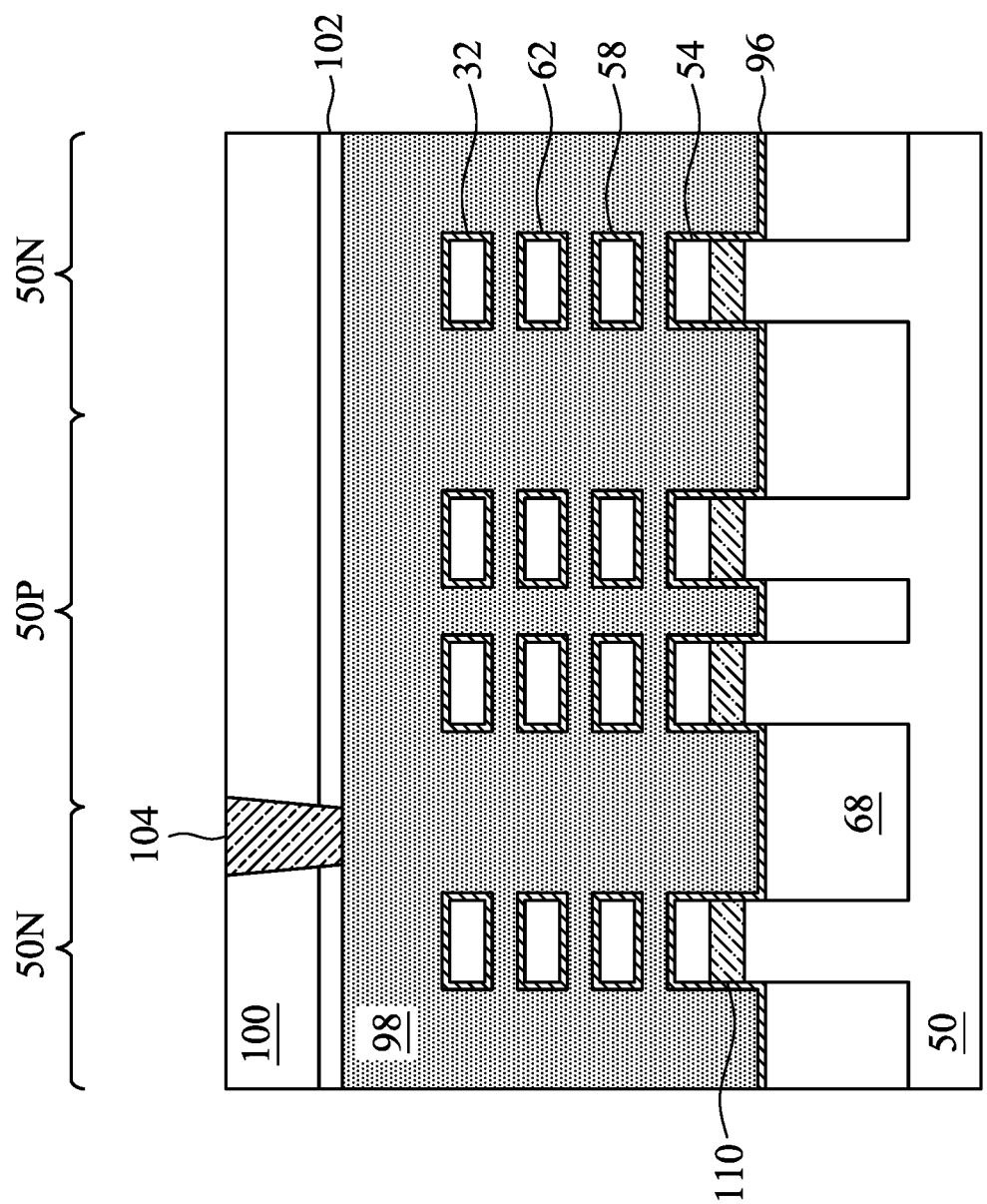
Figure 23B:
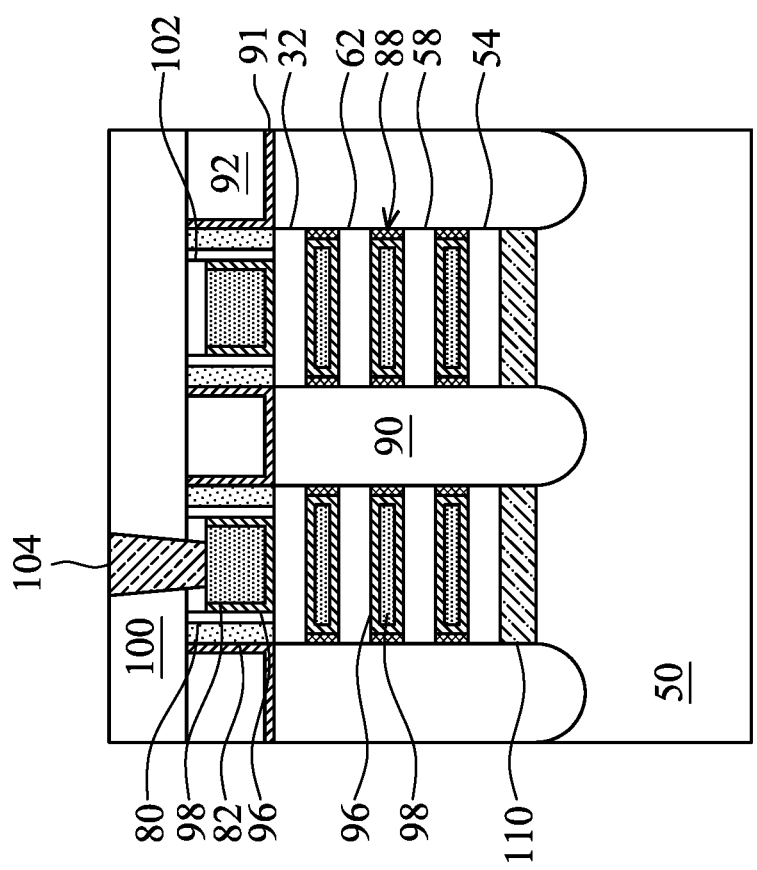

In FIGS. 23A-23B, gate contacts 104 are formed. The gate contacts 104 may be physically and electrically coupled to a bottommost metallization pattern 118 in a subsequently formed interconnect structure 112 (discussed below with respect to FIG. 24).Openings for the gate contacts 104 are formed through the second ILD 100 and the gate mask 102. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 100. The remaining liner and conductive material form the gate contacts 104 in the openings. The gate contacts 104 are physically and electrically coupled to the gate electrodes 98.

Figure 24:
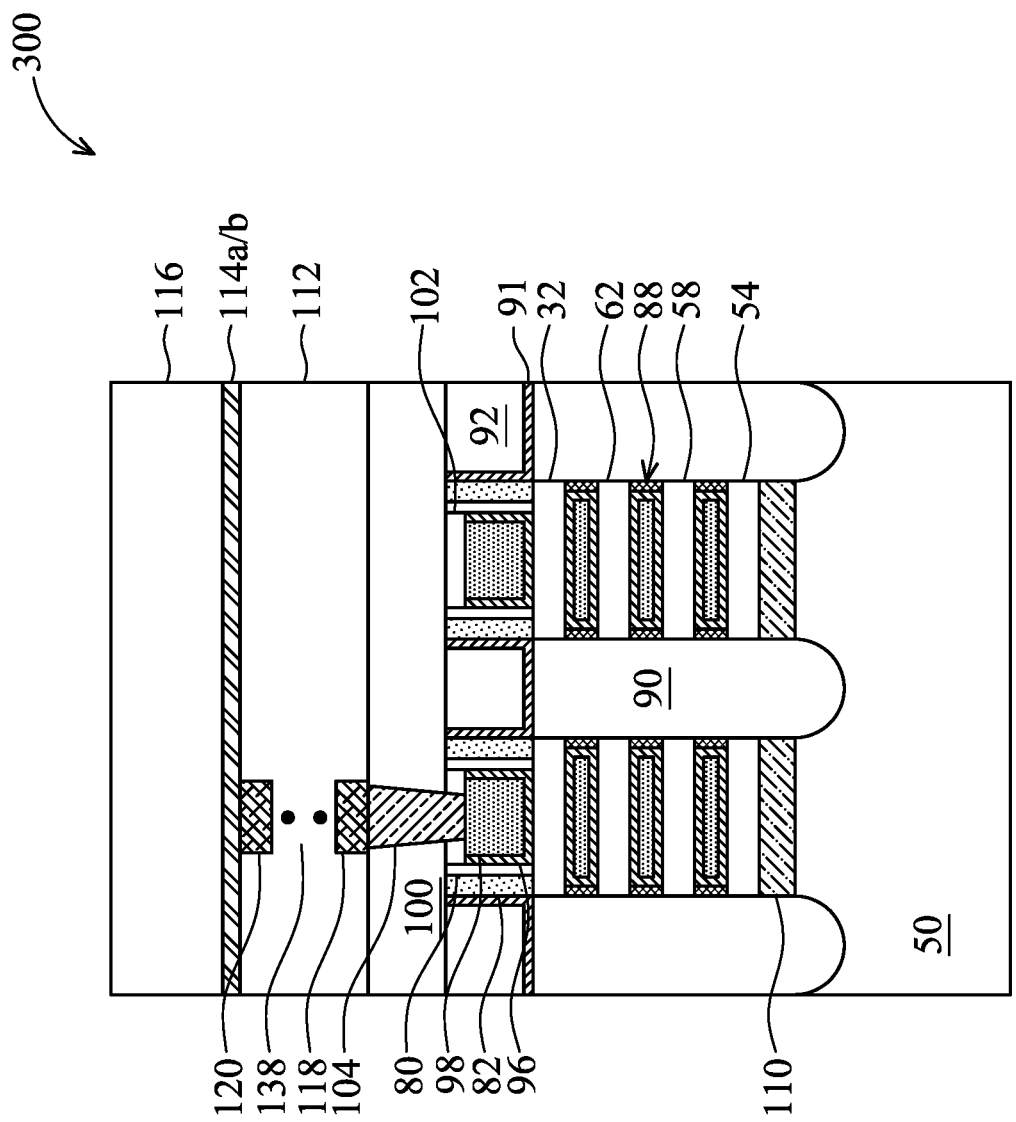

FIGS. 24, 25, 26, 27, 28, 29 and 32 are various cross-sectional views showing the formation of a backside power rail and interconnect structure according to various embodiments. These steps are used in the forming of semiconductor device 300. In FIG. 24, interconnect structure 112 may be formed on the second ILD 100. In some embodiments, the interconnect structure 112 includes electrical routing formed over the second ILD 100. The electrical routing 138 may be formed of one or more layers of conductive lines in a dielectric (e.g., low-k dielectric material) material with conductive vias interconnecting the layers of conductive lines. For example, the electrical routing 138 may include one to three layers of conductive lines. In other embodiments, the electrical routing 138 may include a different number of layers of conductive lines. The conductive vias may extend through the dielectric to provide vertical connections between layers of conductive lines. The electrical routing 138 may be formed through any suitable process (such as deposition, damascene, dual damascene, or the like).

In some embodiments, the electrical routing 138 is formed using a damascene process in which a respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the electrical routing 138 may be formed by depositing a seed layer of copper or a copper alloy, and filling the trenches by electroplating. A chemical mechanical planarization (CMP) process or the like may be used to remove excess conductive material from a surface of the respective dielectric layer and to planarize the surface for subsequent processing.

In FIG. 24, only a topmost metallization pattern 120 and a bottommost metallization pattern 118 in the interconnect structure 112 are illustrated. However, it should be appreciated that the interconnect structure 112 may comprise any number of metallization patterns disposed in any number of dielectric layers. Interconnect structure 112 may be electrically connected to gate contacts 104.

Next, a carrier substrate 116 is bonded to a top surface of the interconnect structure 112 using a suitable technique such as dielectric-to-dielectric bonding, or the like. The carrier substrate 116 may be a glass carrier substrate, a ceramic carrier substrate, a wafer (e.g., a silicon wafer), or the like.

In various embodiments, the carrier substrate 116 may be bonded to the interconnect structure 112 using a suitable technique such as dielectric-to-dielectric bonding, or the like. Dielectric-to-dielectric bonding may comprise the use of a bonding layer 114a and a bonding layer 114b, on a top surface of interconnect structure 112 and a bottom surface of carrier substrate 116, respectively. In some embodiments, the bonding layer 114a and bonding layer 114b may each comprise silicon oxide formed on the top surface of the interconnect structure 112 and the bottom surface of the carrier substrate 116, respectively by a deposition process, such as chemical vapor deposition (CVD), physical vapor deposition (PVD), or the like. In other embodiments, the bonding layer 114b may be formed by the thermal oxidation of a silicon surface on the carrier substrate 116. In alternative embodiments, the bonding layer 114a and the bonding layer 114b may comprise silicon oxynitride, silicon nitride, or the like.

Prior to bonding, at least one of the bonding layers 114a or 114b may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to the bonding layer 114a and/or bonding layer 114b. The carrier substrate 116 is then aligned with the interconnect structure 112 and the two are pressed against each other to initiate a pre-bonding of the carrier substrate 116 to the interconnect structure 112. The pre-bonding may be performed at room temperature (between about 21 degrees and about 25 degrees). After the pre-bonding, a subsequent annealing step may be applied to the semiconductor device 300. For example, this may be done by heating the semiconductor device 300 to a temperature of about 170 degrees to about 500 degrees.

Figure 25:
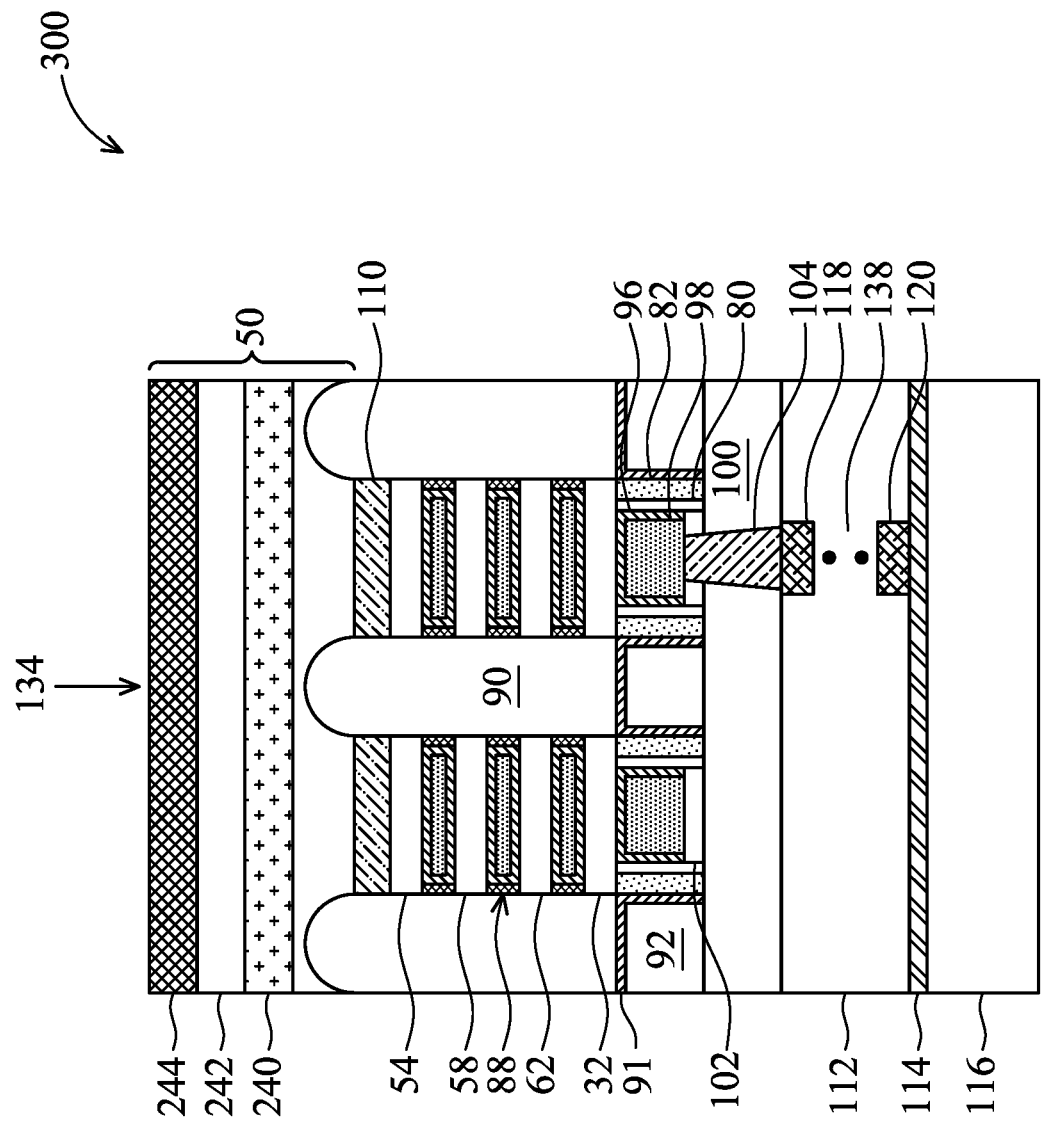
Figure 26:
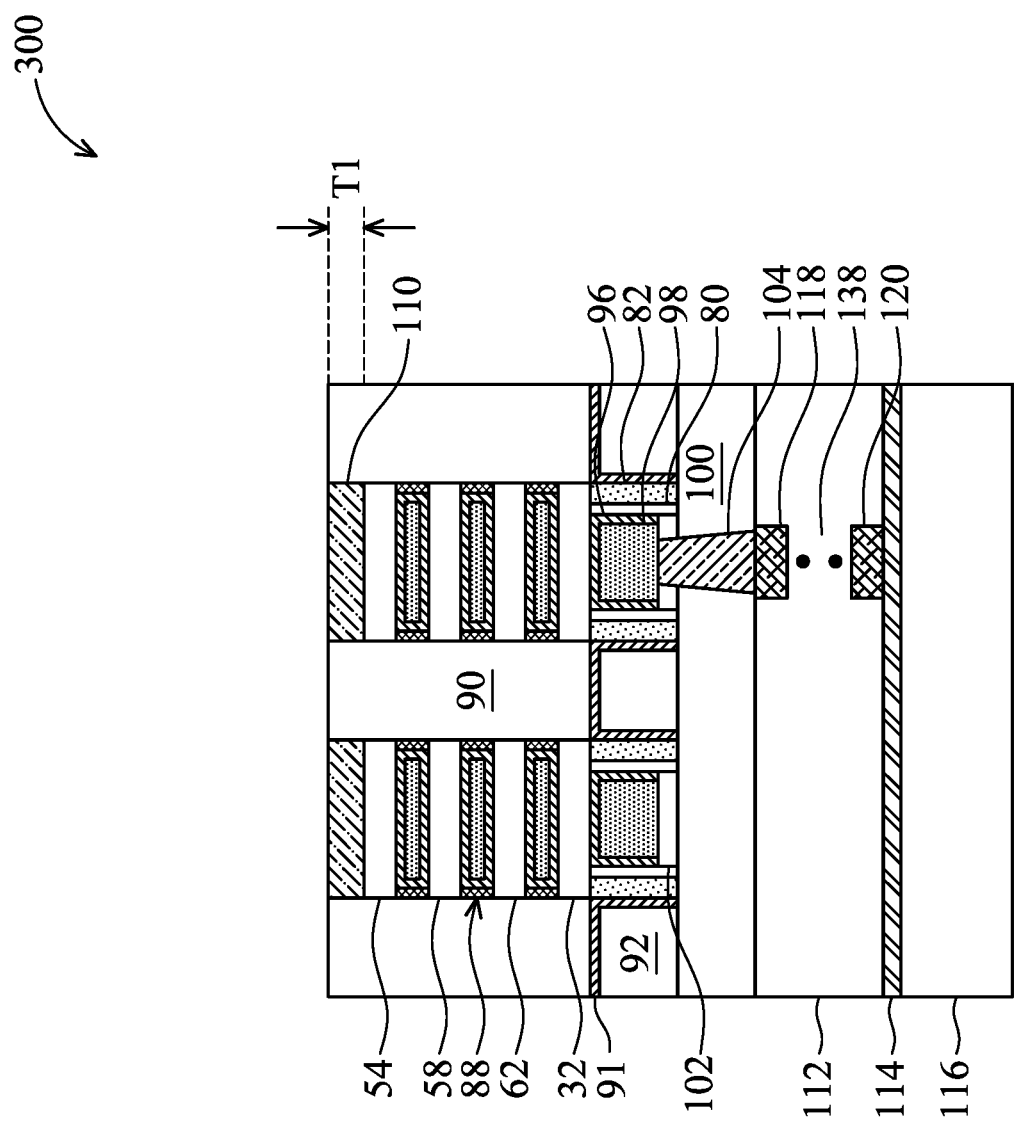

In FIG. 25, semiconductor device 300 is flipped over so that a surface 134 of the substrate 50 is exposed. Next, as illustrated in FIGS. 25-26, a thinning process may be applied to the substrate 50. The thinning process may include grinding or CMP processes, etch back processes, or other acceptable processes performed on the surface 134 of the substrate 50. The thinning process may expose the STI regions 68, dielectric layer 110, gate dielectric layers 96, and the epitaxial source/drain regions 90. During the thinning process, a CMP process may be used that has different CMP selectivity for the heavily doped p-type region 244, the lightly doped p-type region 242, and the silicon-germanium layer 240. The dopant concentration and type of material may influence the removal rate during the CMP process and hence, the removal rate can be controlled to achieve a desired final thickness. After the planarization process, top surfaces of the dielectric layer 110 and the epitaxial source/drain regions 90 are level. After this thinning process, the dielectric layer 110 may have a thickness T1 in the range of between about 6 nm to 20 nm. Providing a dielectric layer 110 having this thickness may have advantages. For example, providing a thinner dielectric layer 110 may lead to insufficient isolation being provided by the dielectric layer 110 between the channel layers of the nano-FETs and the substrate 50. This insufficient isolation may cause gate to power rail short circuiting. Providing a thicker dielectric layer 110 may require an inefficiently thick dielectric layer 132 to be deposited (discussed above with respect to FIG. 13) to fill in recesses 130, increasing manufacturing costs and reducing yield.

Figure 27:
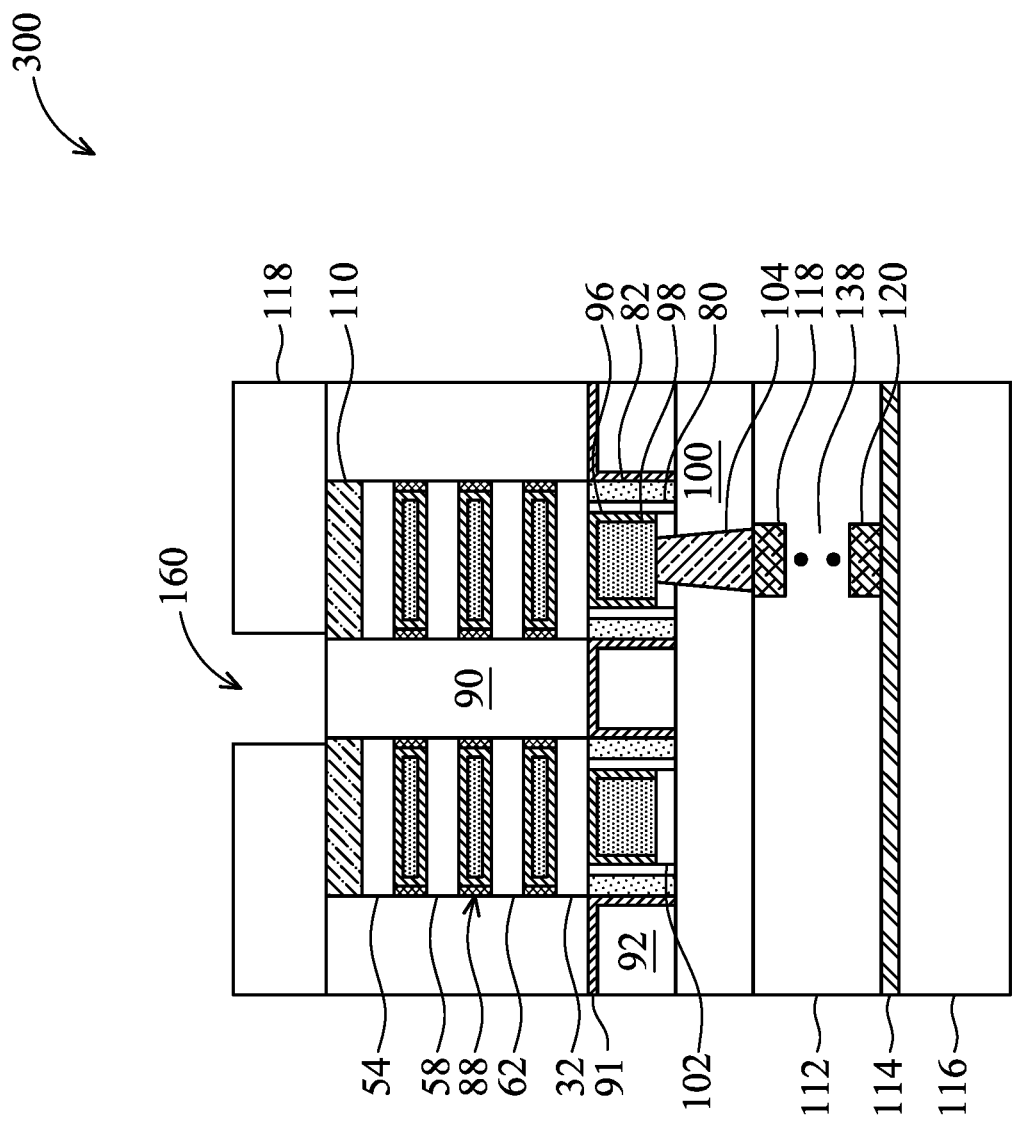

In FIG. 27, an isolation layer 118 is deposited over the dielectric layer 110 and epitaxial source/drain regions 90. The isolation layer 118 may be formed of a dielectric material, and may be deposited by any suitable method, such as CVD, plasma-enhanced CVD (PECVD), or the like. The isolation layer 118 may comprise silicon oxide, silicon oxynitride, silicon nitride, or the like. An opening 160 for the subsequently formed contact via 122 (discussed below with respect to FIG. 28) is formed through the isolation layer 118. The opening 160 may be formed using acceptable photolithography and etching techniques.

Figure 28:
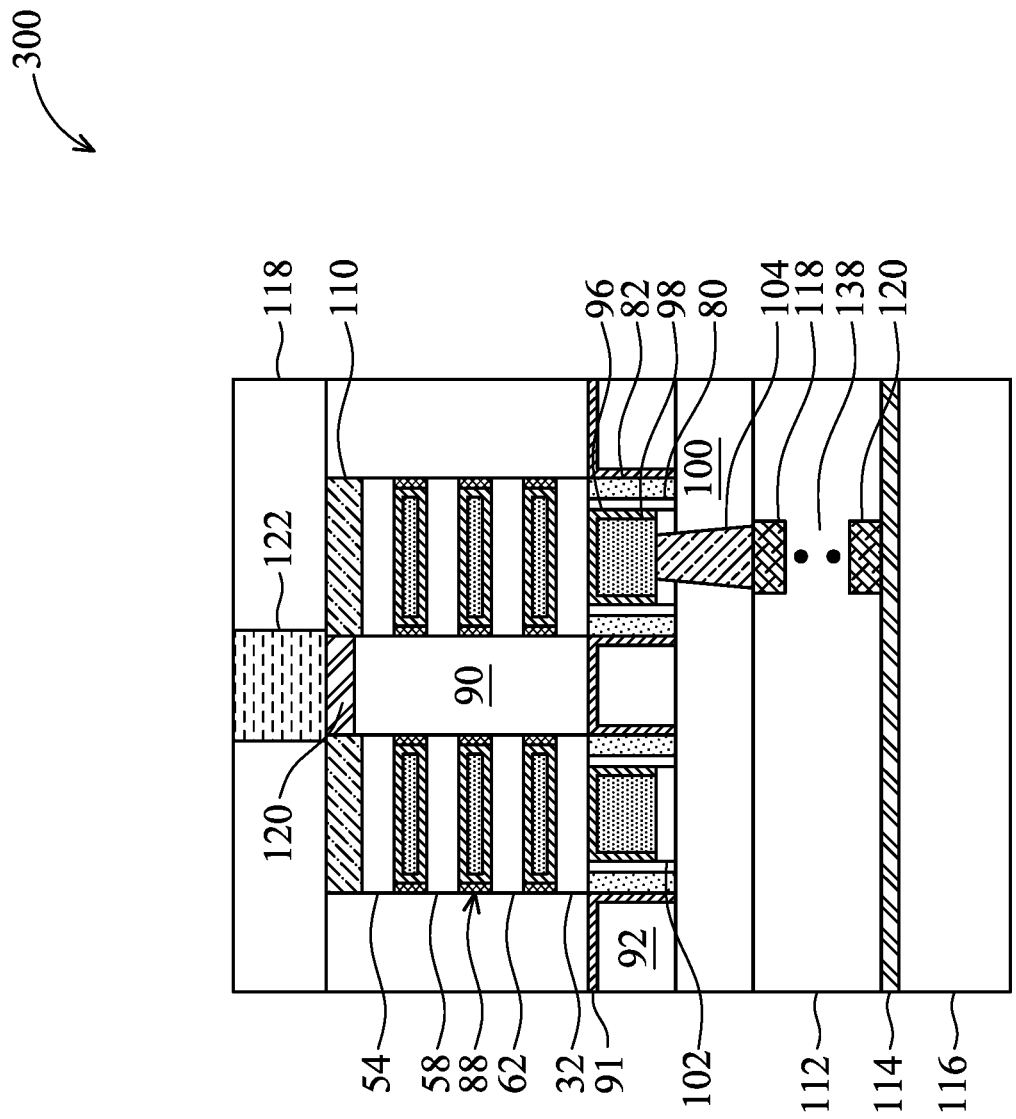

In FIG. 28, a contact via 122 is formed. The contact via 122 may comprise a liner, such as a diffusion barrier layer, an adhesion layer, or the like, and a conductive material in the opening 160. The liner is deposited first, and may include titanium, titanium nitride, tantalum, tantalum nitride, or the like. Next, opening 160 is filled with the conductive material. The conductive material may be copper, a copper alloy, silver, gold, tungsten, cobalt, aluminum, nickel, or the like. The contact via 122 has bottom portions that overlap top surfaces of the dielectric layer 110 and is physically and electrically coupled to the epitaxial source/drain regions 90. A planarization process, such as a CMP, may be performed to remove excess conductive material from a surface of the isolation layer 118 such that a top surface of the contact via 122 and a top surface of the isolation layer 118 are level. An anneal process may be performed to form a silicide region 120 at the interface between the contact via 122 and the epitaxial source/drain regions 90. An advantageous feature of the dielectric layer 110 is that it provides insulation such that the contact via 122 may overlap the channel layer 54. Consequently, the contact area of contact via 122 can be enlarged (e.g., larger than the width of the epitaxial source/drain regions 90), which improves alignment tolerance, increases manufacturing efficiency, and reduces defects. In addition, dielectric layer 110 prevents short circuiting between the channel layers of the nano-FETs and a subsequently formed power rail 124 (discussed below with respect to FIG. 29) by isolating the contact via 122 from the channel layers (e.g., channel layer 54, channel layer 58, channel layer 62, and channel layer 32) of the nano-FETs.

Figure 29:
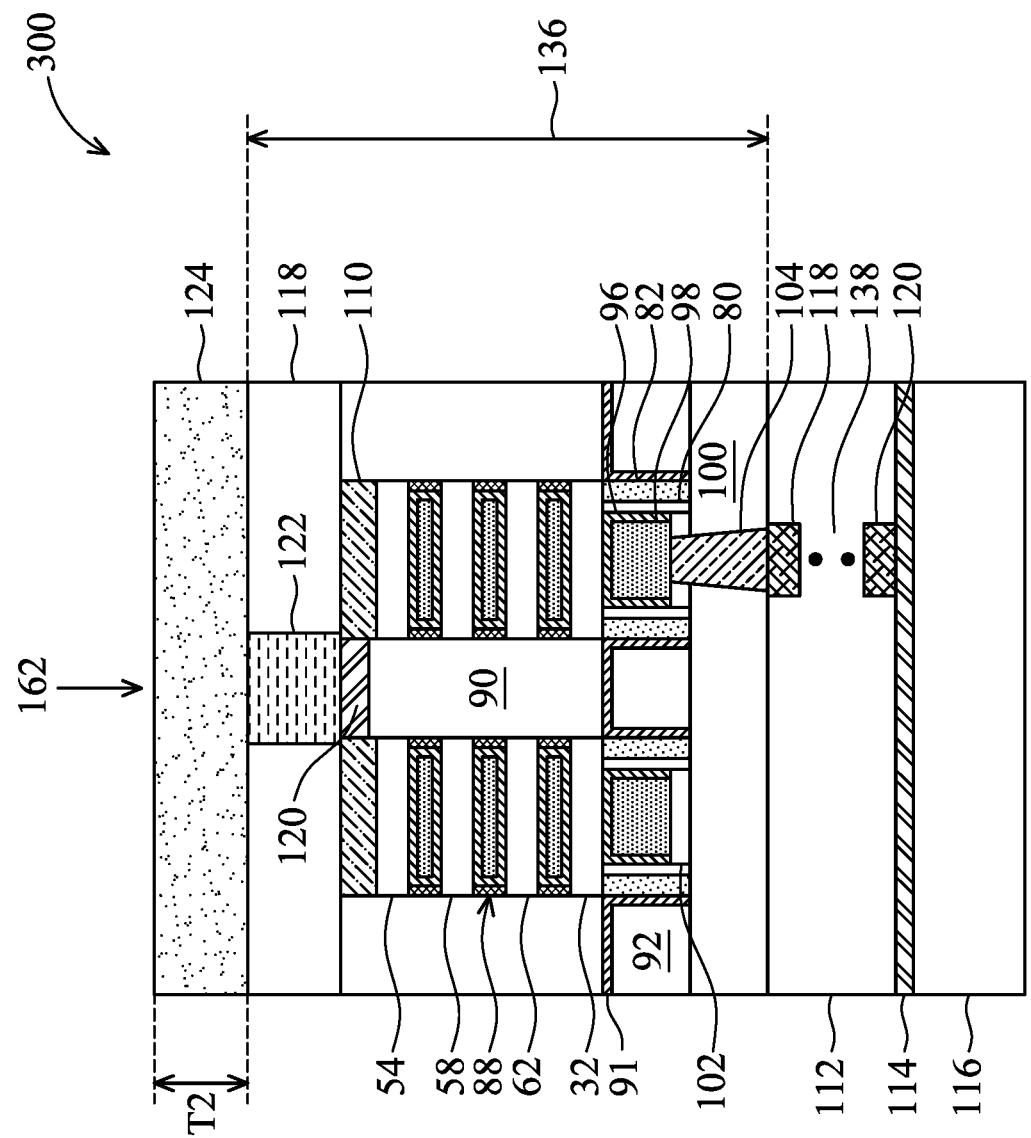

In FIG. 29, power rail 124 is formed. Power rail 124 is formed by depositing a conductive material over the structure illustrated in FIG. 28. In some embodiments, power rail 124 comprises a metal layer, which may be a single layer or a composite layer comprising a plurality of sub-layers formed of different materials. In some embodiments, the power rail 124 comprises copper, aluminum, cobalt, tungsten, titanium, tantalum, ruthenium, or the like. The power rail 124 may be formed using, for example, PVD, plating or the like. Power rail 124 is physically and electrically coupled to the epitaxial source/drain regions 90 through the contact via 122. Subsequently, a planarization process (e.g., a chemical mechanical polish (CMP), grinding, etch back, or the like) may be performed on a surface 162 of the power rail 124. As a result of this thinning process, the power rail 124 may have a thickness T2 in a range of between about 10 nm to about 20 nm. As illustrated in FIG. 29, a portion of the semiconductor device 300 between the interconnect structure 112 and the power rail 124 is referred to as structure 136.

Figure 30A:
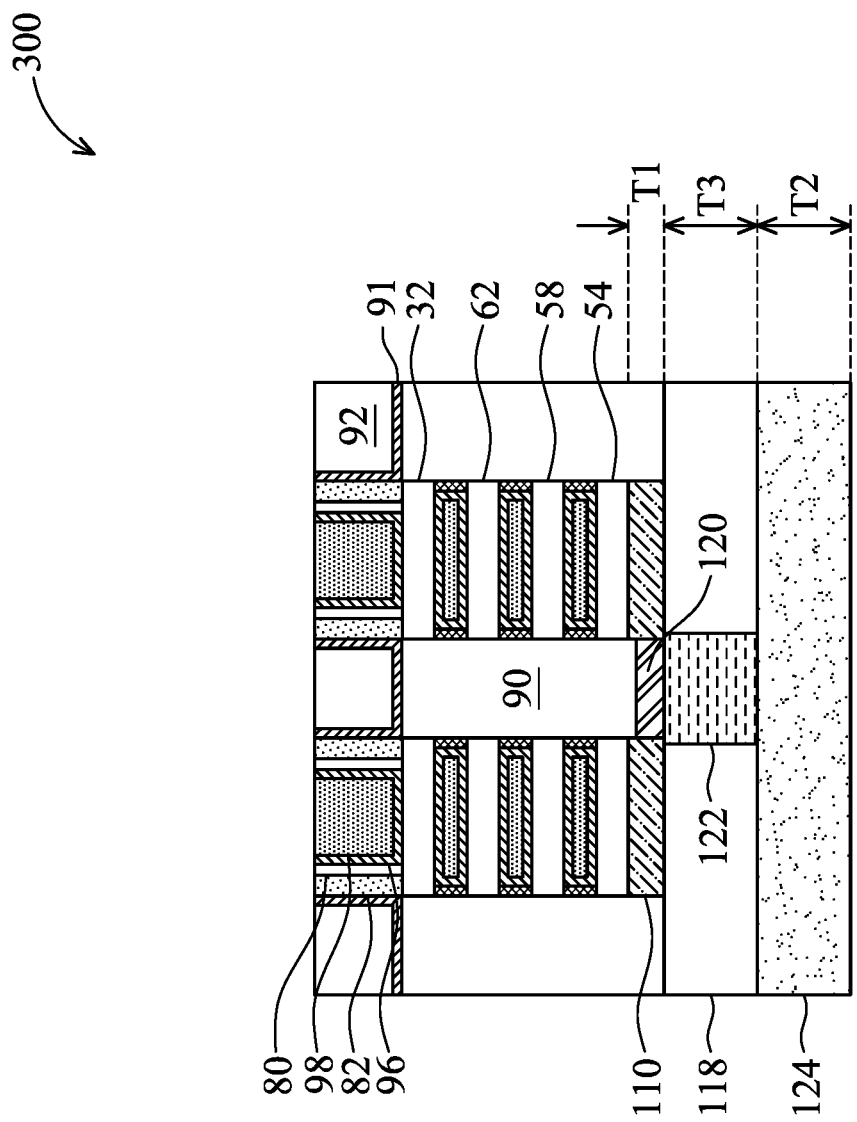

FIG. 30A shows a partial cross-sectional view of the semiconductor device 300 referred to earlier in FIG. 29, along a line similar to one that references the cross-sections B-B' or C-C' as illustrated in FIG. 1. As illustrated in FIG. 30A, bottom portions of dielectric layer 110 may overlap top portions of the contact via 122. The dielectric layer 110 may have a thickness T1 in a range of between about 6 nm to 20 nm. The power rail 124 may have a thickness T2 in a range of between about 10 nm to about 20 nm. The contact via 122 may have a thickness T3 in a range of between about 20 nm to about 40 nm.

Figure 30B:
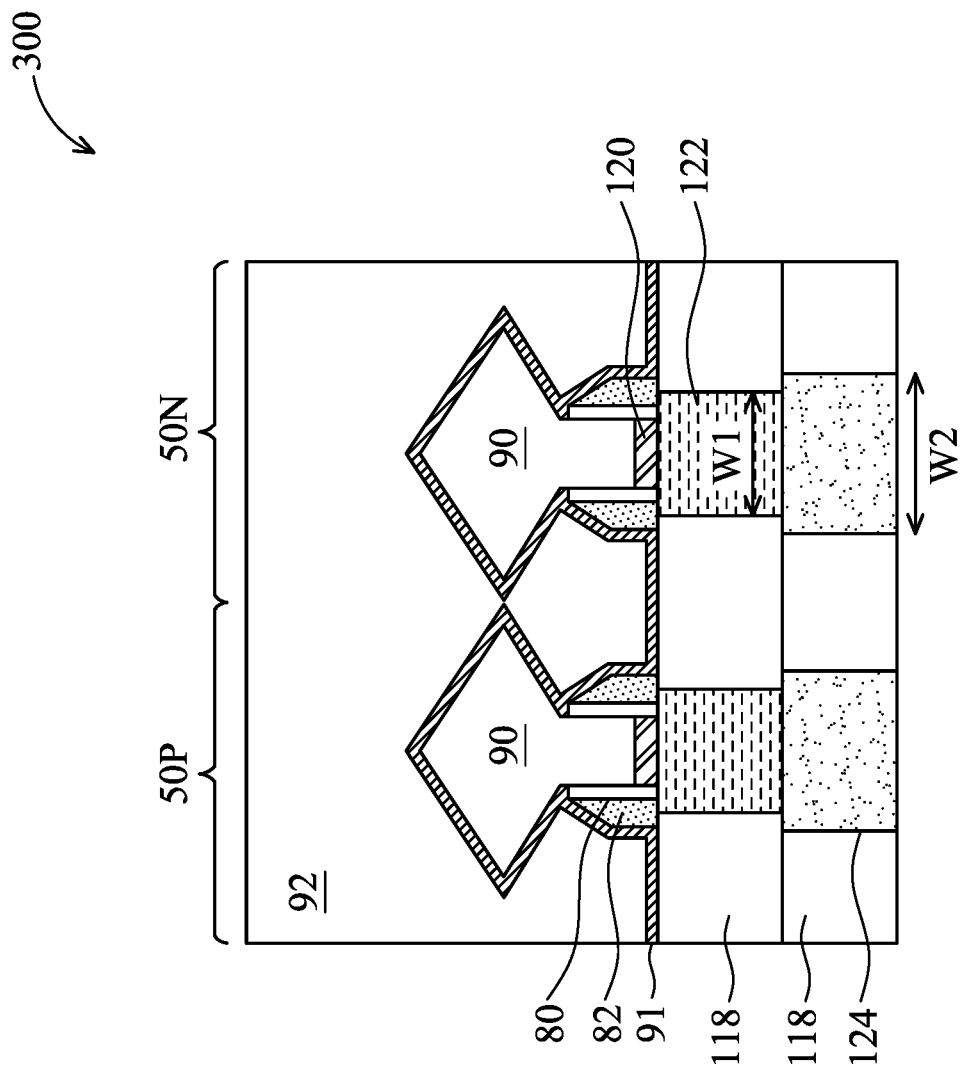

FIG. 30B shows a partial cross-sectional view of the semiconductor device 300 referred to earlier in FIG. 29, along a line similar to one that references the cross-section D-D' as illustrated in FIG. 1. FIG. 30B shows epitaxial source/drain regions 90 in region 50N and region 50P that are adjacent to each other. The region 50N can be for forming n-type devices, such as NMOS transistors, e.g., n-type nano-FETs. The region 50P can be for forming p-type devices, such as PMOS transistors, e.g., p-type nano-FETs. The contact via 122 may have a width W1 in a range of between about 10 nm to 20 nm. The power rail 124 may have a width W2 in a range of between about 20 nm to about 40 nm. The formation of the power rail 124 on the backside of a nano-FET instead of the frontside of the nano-FET allows for the use of a larger power rail width, which helps to reduce electrical resistance. For example, the width W2 of the power rail 124 may be more than twice the width compared to a front side power rail. A larger power rail width may be achieved when forming a power rail on the backside of a nano-FET because the power rail area is not restricted by the presence of the first metal layer interconnect that is formed on the front side of the nano-FET.

Figure 31:
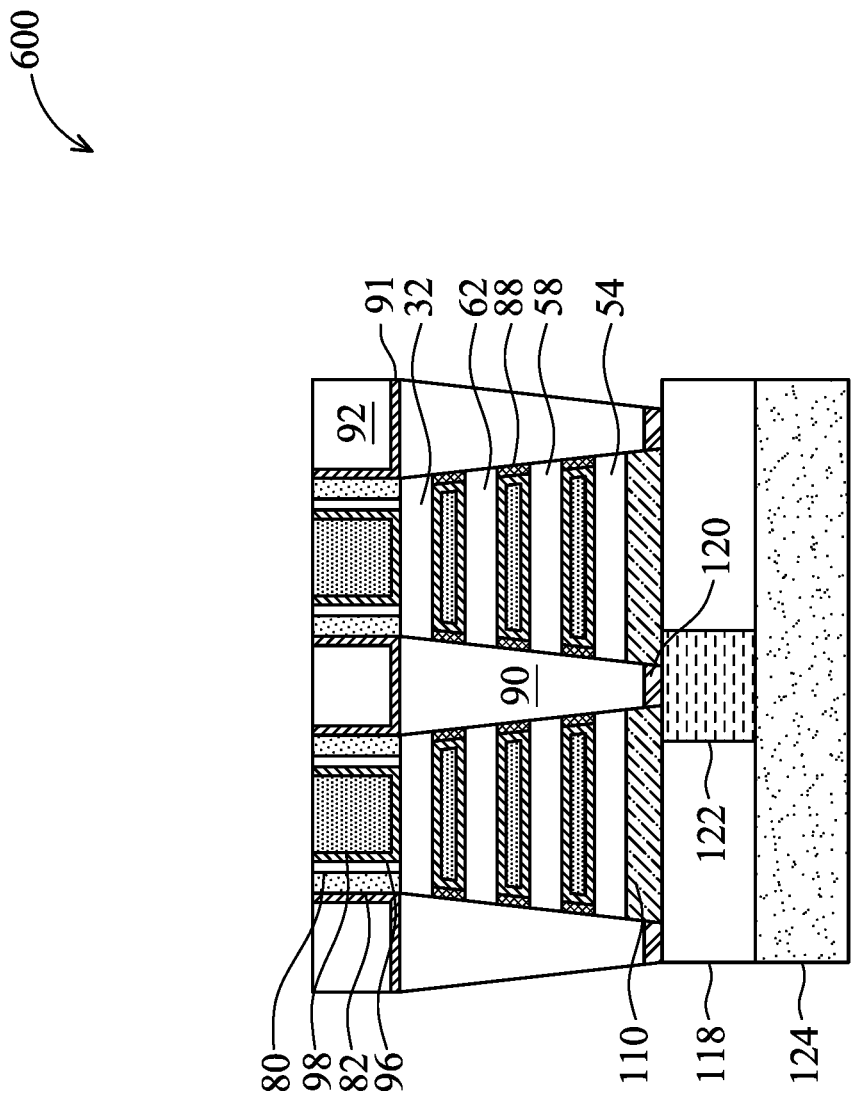

FIG. 31 shows a partial cross-sectional view of a semiconductor device 600, along a line similar to one that references the cross-sections B-B' or C-C' as illustrated in FIG. 1. The semiconductor device 600 is an alternate embodiment of the semiconductor device 300 (shown previously in FIG. 29). As illustrated in FIG. 31, bottom portions of dielectric layer 110 may overlap top portions of the contact via 122. The dielectric layer 110, the channel layer 54, channel layer 58, channel layer 62 and channel layer 32 may each have a trapezoid shape such that a bottom surface of each of the dielectric layer 110, channel layer 54, channel layer 58, channel layer 62 and channel layer 32 has a larger width than a corresponding top surface of each of the dielectric layer 110, channel layer 54, channel layer 58, channel layer 62 and channel layer 32. The contact via 122 may have a larger width than a width of the bottom surface of the epitaxial source/drain regions 90 (e.g., a surface of the epitaxial source/drain regions 90 facing and directly contacting the contact vias 122). Further, the epitaxial source/drain regions 90 may be wider than the contact via 122 at a surface of the source/drain regions 90 opposite the contact via 122.

Figure 32:
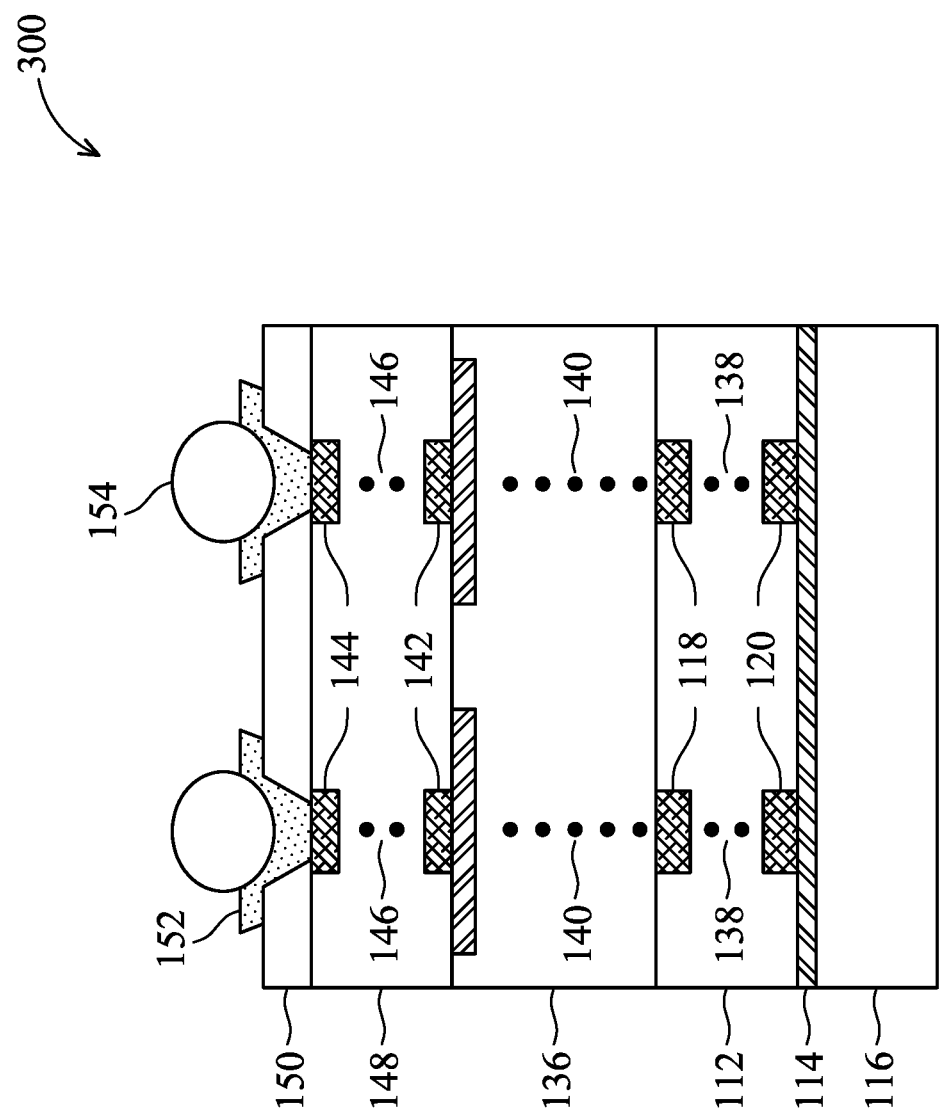

FIG. 32 shows a cross-sectional view showing the formation of an interconnect structure, UBMs, and electrical connectors according to various embodiments. These steps are used in the forming of semiconductor device 300. In FIG. 32, interconnect structure 148 may be formed on structure 136 (which was described earlier in FIG. 29) and power rail 124. In some embodiments, the interconnect structure 148 includes electrical routing formed over the structure 136 and the power rail 124. The electrical routing 146 may be formed of one or more layers of conductive lines in a dielectric (e.g., low-k dielectric material) material with conductive vias interconnecting the layers of conductive lines. For example, the electrical routing 146 may include one to three layers of conductive lines. In other embodiments, the electrical routing 146 may include a different number of layers of conductive lines. The conductive vias may extend through the dielectric to provide vertical connections between layers of conductive lines. The electrical routing 146 may be formed through any suitable process (such as deposition, damascene, dual damascene, or the like).

In some embodiments, the electrical routing 146 is formed using a damascene process in which a respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) process or the like may be used to remove excess conductive material from a surface of the respective dielectric layer and to planarize the surface for subsequent processing.

In FIG. 32, only a topmost metallization pattern 144 and a bottommost metallization pattern 142 in the interconnect structure 148 are illustrated. However, it should be appreciated that the interconnect structure 148 may comprise any number of metallization patterns disposed in any number of dielectric layers. Dielectric layer 150 may be formed over interconnect structure 148. Dielectric layer 150 may comprise polymers such as PBO, polyimide, BCB, or the like. Alternatively, dielectric layer 150 may include non-organic dielectric materials such as silicon oxide, silicon nitride, silicon carbide, silicon oxynitride, or the like.

FIG. 32 also illustrates the formation of UBMs 152 and electrical connectors 154 in accordance with some exemplary embodiments. The formation of electrical connectors 154 may include placing solder balls on the exposed portions of UBMs 152 and then reflowing the solder balls. In alternative embodiments, the formation of electrical connectors 154 includes performing a plating step to form solder regions over the topmost metallization pattern 144 and then reflowing the solder regions. Electrical connectors 154 may also include metal pillars, or metal pillars and solder caps, which may also be formed through plating. Electrical connectors 154 may be electrically connected to one or more power rails 124.

Figure 33:
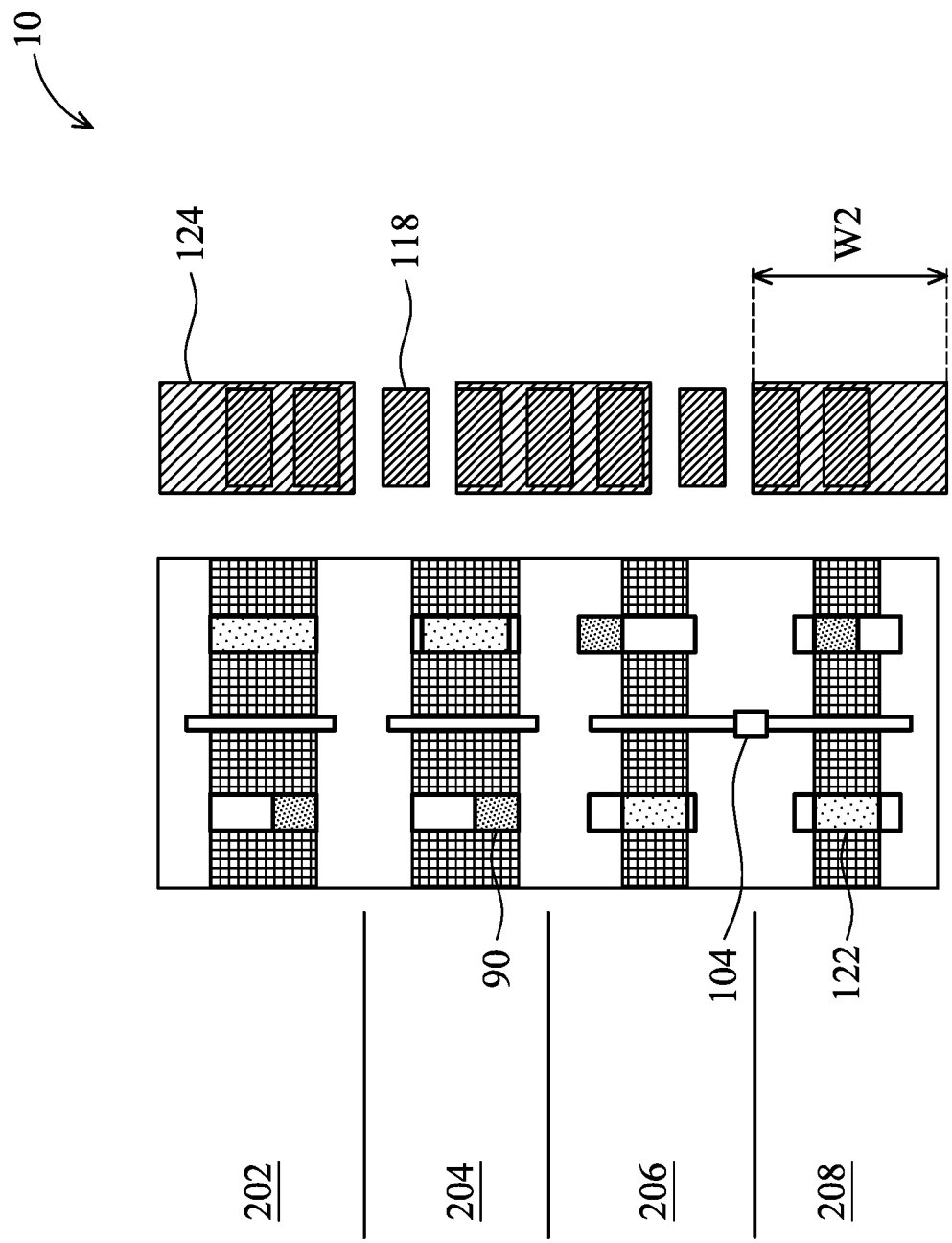
FIG. 33 illustrates a top-down view in accordance with embodiments of the present disclosure.

FIG. 33, illustrates a top-down view of a wafer 10 in accordance with an example embodiment of the present disclosure. Wafer 10 comprises a first circuit 202, a second circuit 204, a third circuit 206, and a fourth circuit 208. The first circuit 202 and the second circuit 204 are adjacent to each other and each comprises a nano-FET. The third circuit 206 and the fourth circuit 208 are also adjacent to each other and each comprises a nano-FET, which share a common gate stack with a single gate contact 104. The first circuit 202 and the third circuit 206 each comprise a p-type nanoFET and the second circuit 204 and the fourth circuit 208 each comprises an n-type nano-FET. The second circuit 204 and the third circuit 206 are electrically isolated from each other. FIG. 33 also illustrates power rails 124 and the width W2 of each of the power rails 124, as well as the contact vias 122 which are physically and electrically coupled to the epitaxial source/drain regions 90. The bottommost metallization pattern 118 in the interconnect structure 112 is also shown. As a result of moving the power rail from the front side to the back side, an advantageous feature may include being able to increase the density of the bottommost metallization pattern 118, as well as an increase in the gate density. For example, power rail 124 may allow a gate density increase of more than 6 percent compared to a gate density when using a frontside power rail.

The embodiments of the present disclosure have some advantageous features. Forming a power rail on a backside of nano-FETs in combination with forming a dielectric layer that extends between bulk regions of the nano-FETs, and each of the channel regions and gates of the nano-FETs may include the ability to allow for the formation of a power rail with a width that may be more than twice the width of a frontside power rail. The larger power rail width subsequently allows for an increase in the first metal layer interconnect density as well as an increase of more than 6 percent in gate density as compared to a gate density when using a frontside power rail. In addition, the use of a wider power rail width may include the ability to lower electrical resistance.

In accordance with an embodiment, a semiconductor device includes a power rail; a dielectric layer over the power rail; a first channel region over the dielectric layer; a second channel region over the first channel region; a gate stack over the first channel region and the second channel region, where the gate stack is further disposed between the first channel region and the second channel region; and a first source/drain region adjacent the gate stack and electrically connected to the power rail. In an embodiment, the sidewalls of the dielectric layer are convex or concave. In an embodiment, the first source/drain region is electrically connected to the power rail through a contact via. In an embodiment, where a top surface of the contact via directly contacts a bottom surface of the dielectric layer. In an embodiment, the semiconductor device further includes a silicide region between the contact via and the first source/drain region.

In an embodiment, the dielectric layer has a thickness in a range of 6 nm to 20 nm. In an embodiment, the dielectric layer includes silicon oxide, silicon nitride, silicon carbon nitride, silicon carbon oxynitride, a metal oxide, or a combination thereof. In an embodiment, the gate stack extends over sidewalls of the dielectric layer.

In accordance with an embodiment, a method includes depositing a sacrificial layer, a first semiconductor layer, a second semiconductor layer, and a third semiconductor layer sequentially over a semiconductor substrate; removing the sacrificial layer to form a first recess; depositing a dielectric layer in the first recess; forming an epitaxial source/drain region extending through the dielectric layer; removing the second semiconductor layer to form a second recess; forming a gate stack extending over a top surface of the third semiconductor layer and sidewalls of the third semiconductor layer and first semiconductor layer, where the gate stack fills the second recess; thinning a surface of the semiconductor substrate to expose the epitaxial source/drain region and the dielectric layer; forming a conductive contact connected to the epitaxial source/drain region; and forming a backside power rail on an opposite side of the dielectric layer as the first semiconductor layer, where the backside power rail is electrically connected to epitaxial source/drain region through the conductive contact. In an embodiment, the dielectric layer insulates the backside power rail from the first semiconductor layer. In an embodiment, the sacrificial layer has a first germanium concentration that is lower than a second germanium concentration of the second semiconductor layer. In an embodiment, the first germanium concentration is in a range from $10^{10}$ atoms/cm$^3$ to about $10^{15}$ atoms/cm$^3$, and the second germanium concentration is in a range from $10^{20}$ atoms/cm$^3$ to about $10^{35}$ atoms/cm$^3$. In an embodiment, the conductive contact is wider than the epitaxial source/drain region at an interface where the conductive contact contacts the epitaxial source/drain region. In an embodiment, where removing the sacrificial layer includes etching sidewalls of the second semiconductor layer using an etchant that etches the second semiconductor layer at a faster rate than the sacrificial layer; forming spacers on the sidewalls of the second semiconductor layer; and etching the sacrificial layer, where the spacers mask the sidewalls of the second semiconductor layer while the sacrificial layer is etched.

In accordance with an embodiment, a semiconductor device includes a power rail; a first channel region over the power rail; a second channel region over the first channel region; an isolation layer extending between the first channel region and the power rail; a gate stack over the first channel region, second channel region, and isolation layer, where a portion of the gate stack is further disposed between the first channel region and the second channel region; a first source/drain region adjacent the gate stack, the first source/drain region extending through the isolation layer; and a contact plug directly contacting the power rail, where the contact plug electrically connects the power rail to the first source/drain region. In an embodiment, the semiconductor device further includes a first interconnect structure in direct contact with the power rail; a second interconnect structure, where the first interconnect structure and the second interconnect structure are on opposite sides of the power rail; and a first plurality of conductive features over the first interconnect structure, where the first plurality of conductive features includes solder regions electrically coupled to the power rail. In an embodiment, the isolation layer electrically isolates the power rail from the first channel region. In an embodiment, a top surface of the contact plug is in direct contact with the isolation layer. In an embodiment, a first width of the contact plug is smaller than a second width of the power rail. In an embodiment, the semiconductor device further includes a dielectric layer extending between the isolation layer and the power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a power rail;
   a dielectric layer over the power rail;
   a first channel region over the dielectric layer;
   a second channel region over the first channel region;
   a gate stack over the first channel region and the second channel region, wherein the gate stack is further disposed between the first channel region and the second channel region; and
   a first source/drain region adjacent the gate stack and electrically connected to the power rail, wherein the first source/drain region is electrically connected to the power rail through a contact via, and wherein a top surface of the contact via directly contacts a bottom surface of the dielectric layer.

2. The semiconductor device of claim 1, wherein sidewalls of the dielectric layer are convex or concave.

3. The semiconductor device of claim 1, further comprising a silicide region between the contact via and the first source/drain region.

4. The semiconductor device of claim 1, wherein the dielectric layer has a thickness in a range of 6 nm to 20 nm.

5. The semiconductor device of claim 1, wherein the dielectric layer comprises silicon oxide, silicon nitride, silicon carbon nitride, silicon carbon oxynitride, a metal oxide, or a combination thereof.

6. The semiconductor device of claim 1, wherein the gate stack extends over sidewalls of the dielectric layer.

7. The semiconductor device of claim 1, wherein the dielectric layer comprises a trapezoid shape.

8. The semiconductor device of claim 1, wherein the gate stack extends below a bottom surface of the dielectric layer.

9. A method of forming a semiconductor device, the method comprising:
   depositing a sacrificial layer, a first semiconductor layer, a second semiconductor layer, and a third semiconductor layer sequentially over a semiconductor substrate;
   removing the sacrificial layer to form a first recess;
   depositing a dielectric layer in the first recess;
   forming an epitaxial source/drain region extending through the dielectric layer;
   removing the second semiconductor layer to form a second recess;
   forming a gate stack extending over a top surface of the third semiconductor layer and sidewalls of the third semiconductor layer and first semiconductor layer, wherein the gate stack fills the second recess;
   thinning a surface of the semiconductor substrate to expose the epitaxial source/drain region and the dielectric layer;
   forming a conductive contact connected to the epitaxial source/drain region; and
   forming a backside power rail on an opposite side of the dielectric layer as the first semiconductor layer, wherein the backside power rail is electrically connected to epitaxial source/drain region through the conductive contact.

10. The method of claim 9, wherein the dielectric layer insulates the backside power rail from the first semiconductor layer.

11. The method of claim 9, wherein the sacrificial layer has a first germanium concentration that is lower than a second germanium concentration of the second semiconductor layer.

12. The method of claim ii, wherein the first germanium concentration is in a range from $10^{10}$ low atoms/cm$^3$ to about $10^{15}$ atoms/cm$^3$, and the second germanium concentration is in a range from $10^{20}$ atoms/cm$^3$ to about $10^{35}$ atoms/cm$^3$.

13. The method of claim 9, wherein the conductive contact is wider than the epitaxial source/drain region at an interface where the conductive contact contacts the epitaxial source/drain region.

14. The method of claim 9, wherein removing the sacrificial layer comprises:
   etching sidewalls of the second semiconductor layer using an etchant that etches the second semiconductor layer at a faster rate than the sacrificial layer;
   forming spacers on the sidewalls of the second semiconductor layer; and
   etching the sacrificial layer, wherein the spacers mask the sidewalls of the second semiconductor layer while the sacrificial layer is etched.

15. A semiconductor device comprising:
   a power rail;
   a first channel region over the power rail;
   a second channel region over the first channel region;
   an isolation layer extending between the first channel region and the power rail;
   a gate stack over the first channel region, second channel region, and isolation layer, wherein a portion of the gate stack is further disposed between the first channel region and the second channel region;
   a first source/drain region adjacent the gate stack, the first source/drain region extending through the isolation layer; and a contact plug directly contacting the power rail, wherein the contact plug electrically connects the power rail to the first source/drain region, and wherein a top surface of the contact plug is in direct contact with the isolation layer.

16. The semiconductor device of claim 15, further comprising:
a first interconnect structure in direct contact with the power rail;
a second interconnect structure, wherein the first interconnect structure and the second interconnect structure are on opposite sides of the power rail; and
a first plurality of conductive features over the first interconnect structure, wherein the first plurality of conductive features comprise solder regions electrically coupled to the power rail.

17. The semiconductor device of claim 15, wherein the isolation layer electrically isolates the power rail from the first channel region.

18. The semiconductor device of claim 15, wherein a first width of the contact plug is smaller than a second width of the power rail.

19. The semiconductor device of claim 15, further comprising a dielectric layer extending between the isolation layer and the power rail.

20. The semiconductor device of claim 15, wherein the isolation layer comprises a metal oxide.

* * * * *